(12) United States Patent
Tanaka et al.

(10) Patent No.: US 6,790,723 B2
(45) Date of Patent: Sep. 14, 2004

(54) SEMICONDUCTOR DEVICE AND METHOD OF MANUFACTURING THE SAME

(75) Inventors: Masayuki Tanaka, Yokohama (JP); Shigehiko Saida, Yokohama (JP); Yoshitaka Tsunashima, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/984,404

(22) Filed: Oct. 30, 2001

(65) Prior Publication Data

US 2002/0024119 A1 Feb. 28, 2002

Related U.S. Application Data

(62) Division of application No. 09/478,369, filed on Jan. 6, 2000, now Pat. No. 6,333,547.

(30) Foreign Application Priority Data

| Jan. 8, 1999 | (JP) | ............................................. | 11-002895 |
| Jun. 10, 1999 | (JP) | ............................................. | 11-163202 |
| Sep. 28, 1999 | (JP) | ............................................. | 11-274703 |
| Dec. 17, 1999 | (JP) | ............................................. | 11-359463 |

(51) Int. Cl.$^7$ .......................................... H01L 21/8242
(52) U.S. Cl. ...................... 438/243; 438/637; 438/238
(58) Field of Search ................................ 438/637, 486, 438/238, 243, 239; 257/301–302

(56) References Cited

U.S. PATENT DOCUMENTS

| 4,810,673 A | 3/1989 | Freeman ..................... 438/239 |
| 6,326,658 B1 * | 12/2001 | Tsunashima et al. ........ 257/301 |
| 6,559,486 B2 * | 5/2003 | Ueda .......................... 257/217 |

OTHER PUBLICATIONS

Wolf et al., "Silicon Processing for the VLSI ERA", vol. 1, 1986, pp. 191, 193–194.*

* cited by examiner

*Primary Examiner*—Long Pham
*Assistant Examiner*—Hoa B. Trinh
(74) *Attorney, Agent, or Firm*—Finnegan, Henderson, Farabow, Garrett & Dunner, L.L.P.

(57) ABSTRACT

Hexachlorodisilane ($Si_2Cl_6$) is used as a Si raw material for forming a silicon nitride film that can be widely different in the etching rate from a silicon oxide film. The silicon nitride film is formed by an LPCVD method.

4 Claims, 21 Drawing Sheets

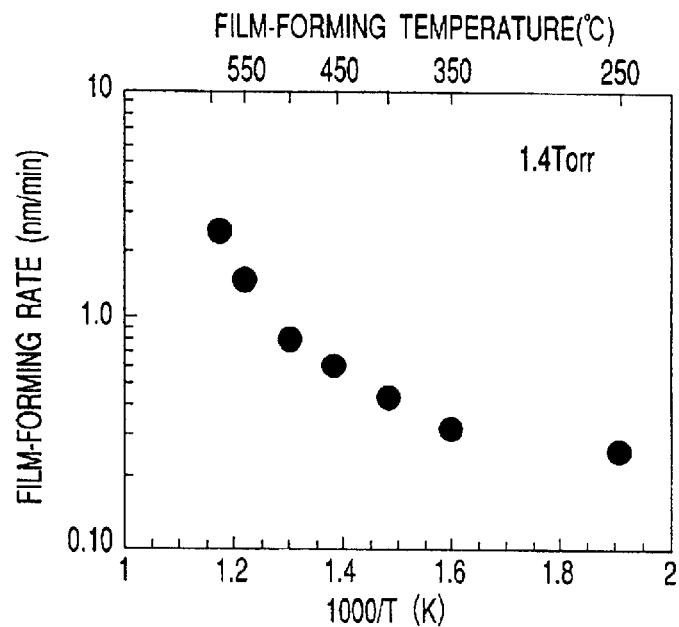
F I G. 7
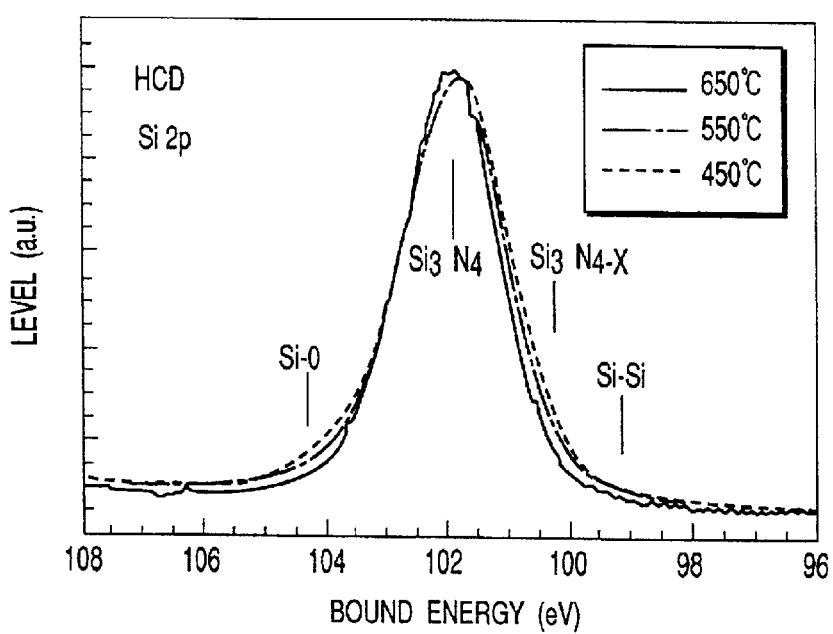
F I G. 8

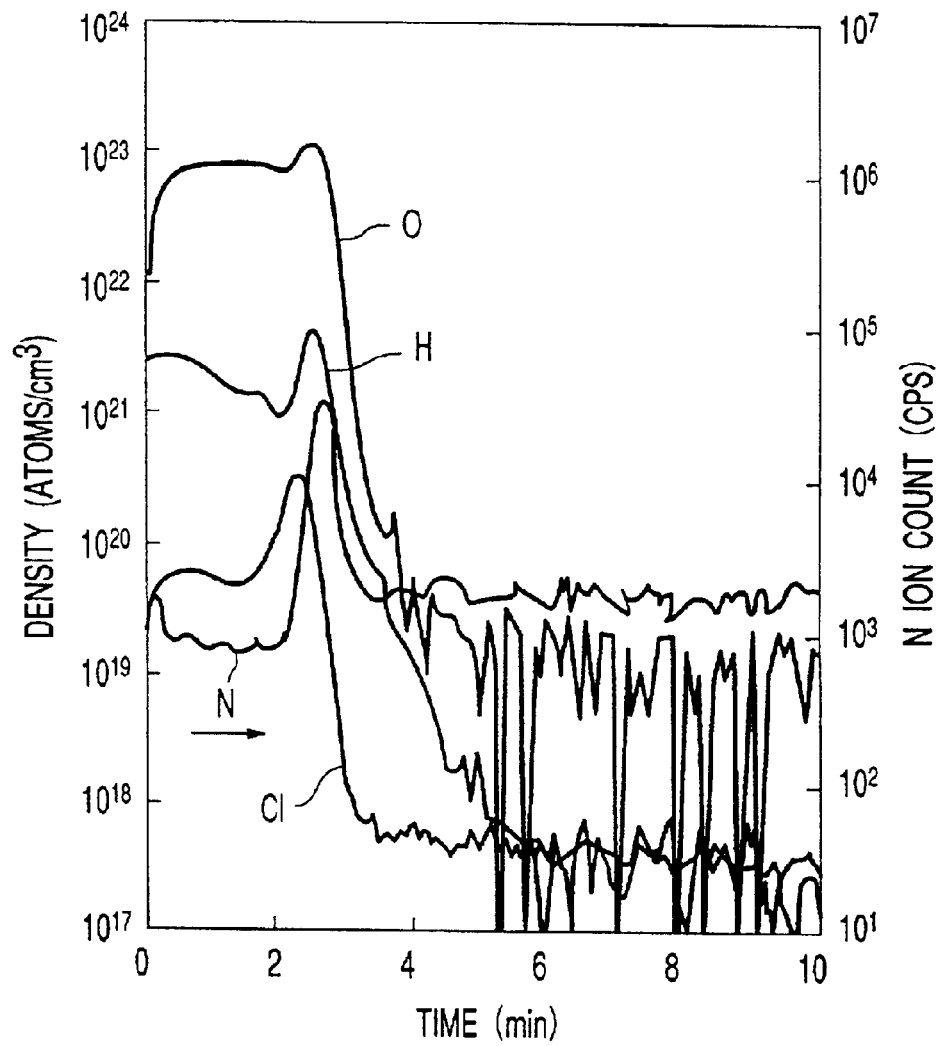
F I G. 22

SEMICONDUCTOR DEVICE AND METHOD OF MANUFACTURING THE SAME

This is a division of application Ser. No. 09/478,369, filed Jan. 6, 2000 now U.S. Pat. No. 6,333,547, which is incorporated herein by reference.

BACKGROUND OF THE INVENTION

The present invention relates to a semiconductor device including a silicon nitride film containing chlorine and a method of manufacturing the same.

With progress in the degree of integration and fineness of the semiconductor device, a semiconductor device of the next era makes it absolutely necessary to develop a process technology that permits forming an interlayer insulating film ($SiO_2$ film) having a finer contact hole of a higher aspect ratio, that permits forming a uniform silicon nitride film of a high step coverage within the contact hole made in the interlayer insulating layer, and that permits polishing the silicon nitride film by a chemical mechanical polishing (CMP) to achieve a buried shape of the silicon nitride film as designed and having a high flatness.

The particular technology is employed in the case of forming a device structure as shown in, for example, FIG. 33 showing a cross section in a direction perpendicular to the longitudinal direction of the channel of a MOS transistor included in a DRAM cell.

In the structure shown in FIG. 33, a drain diffusion layer 682 is formed in a surface region of a silicon substrate 681. Also, an interlayer insulating film ($SiO_2$ film) 685 is formed on the surface of the silicon substrate 681. A contact hole 683 and a wiring trench 684 connected to the drain diffusion layer 682 through the contact hole 683 are formed in the interlayer insulating film 685.

A buried wiring 686 made of tungsten is formed to fill the contact hole 683 and a lower portion of the wiring trench 684. Also, a silicon nitride film 687 is formed on the side walls of the contact hole 683 and the lower portion of the wiring trench 684.

The buried wiring 686 is formed to fill completely the contact hole 683 and to fill only the lower portion of the wiring trench 684. An upper portion of the wiring trench 684, which is not filled with the buried wiring 686, is filled with a silicon nitride film 688. The silicon nitride film 688 of this kind is called a cap insulating film. The cap insulating film is intended to prevent short-circuiting between a lower capacitor electrode 689 formed on the cap insulating film and the buried wiring 686.

The cap insulating film is used as a mask in the step of forming by RIE (Reactive Ion Etching) a contact hole for the capacitor, i.e., a contact hole for connecting the lower capacitor electrode to an $n^+$-type source diffusion layer, in the interlayer insulating film ($SiO_2$ film) 685. Therefore, the silicon nitride film 688, which exhibits a high selectivity ratio, is used as the cap insulating film.

A Ti/TiN laminate film 690 is formed as a barrier metal film at the bottom of the contact hole 683 so as to prevent reaction between the drain diffusion layer 682 and the buried wiring 686 in the subsequent heat treating step.

Where the wiring trench 684 has an aspect ratio not smaller than 1, it was customary to form the silicon nitride film (DCS-SiN film) 688 by a low pressure chemical vapor deposition method (LPCVD method), which is a CVD method having a good step coverage and performed by using dichlorosilane (DCS) as the Si raw material.

However, the conventional method described above gives rise to problems as pointed out below.

First of all, a ratio of the polishing rate by CMP of the interlayer insulating film ($SiO_2$) 685 to the DCS-SiN film 688 is about 30, which is not sufficiently high. Therefore, in the step of removing by CMP an excess DCS-SiN film 688 outside the wiring trench 684, the interlayer insulating film 685 fails to perform the function of a stopper. As a result, the DCS-SiN film 688 is excessively polished. In this case, the thickness of the DCS-SiN film 688 is rendered thinner than the design value, as shown in FIG. 34, giving rise to problems. For example, leakage current between the buried wiring 686 and the lower capacitor electrode 689 is increased. Also, the breakdown voltage is lowered.

What should also be noted is that, in forming the contact hole for the capacitor by etching, the DCS-SiN film 688 is used as a mask. If the DCS-SiN film 688 is excessively polished, short-circuiting is brought about in the worst case between the buried wiring 686 and the lower capacitor electrode 689, as shown in FIG. 35.

In recent years, demands for an improvement in the degree of integration and operating speed of a semiconductor device are on a sharp increase. To meet these demands, vigorous efforts are being made in an attempt to shorten the distance between adjacent device elements and to miniaturize the device element. At the same time, vigorous studies are being made in an attempt to decrease the resistance of the buried wiring and to diminish the parasitic capacitance.

In, for example, DRAM, the degree of integration is prominently increased. Therefore, in forming a contact hole, it is necessary to form a narrow stepped shape having a large aspect ratio. To meet this requirement, a silicon nitride film (SiN film) having a high selectivity ratio has come to be used in, for example, DRAM as an etching stopper film in forming a contact hole in an interlayer insulating film (e.g., TEOS oxide film) by RIE.

It is necessary for the SiN film used as an etching stopper film (RIE stopper film) of this kind to exhibit a selectivity ratio for RIE that is sufficiently high relative to an oxide film such as a BPSG film or a TEOS film. Further, in accordance with progress in the degree of integration and miniaturization of the device element, it is necessary to cover homogeneously and uniformly a narrow stepped shape having a severer aspect ratio.

To meet these requirements, it was customary in forming a contact hole to use as a RIE stopper film a relatively dense SiN film formed by the LPCVD method at about 780° C. by using dichlorosilane (DCS) and ammonia as raw materials. Where a TEOS film is etched by RIE, the RIE selectivity of the TEOS film relative to the SiN film thus formed is as high as about 7, and the SiN film was found to exhibit a permittivity of about 7.5. However, the permittivity of 7.5 is relatively large. Particularly, the capacitance between adjacent wirings or the RC delay time of the entire device element are greatly dependent in recent years on the capacitance of the RIE stopper film in accordance with miniaturization of the device element. As a matter of fact, the capacitance of the RIE stopper film appears as a delay in the operating speed of the device element in a DRAM of the 0.18 micron era et seq.

Also, use of the SiN film as a RIE stopper film leads to an increased bit line capacitance. In order to make up for the increased bit line capacitance, it is necessary to prepare a capacitor having a large capacitance, leading to disadvantages in the characteristics of the device.

Further, in the case of using a SiN film as a RIE stopper film, the conditions for RIE must be changed to those adapted for etching the SiN film after formation of an opening by etching in an oxide film such as a BPSG film or a TEOS film. It should be noted in this connection that the opening has a large aspect ratio and a small diameter, giving rise to various problems. For example, the SiN film at the bottom of the opening cannot be removed by RIE uniformly over the entire planar region, with the result that the residue of the SiN film tends to remain on the bottom portion. Also, since the silicon substrate is directly exposed to RIE, damages done to the substrate are worried about. In this case, an over-etching cannot be performed sufficiently and, thus, the SiN film partly remains unremoved, giving rise to a possibility that an unsatisfactory electrical contact will be brought about.

In the next step, a treatment with a dilute hydrofluoric acid is carried out for removing the native oxide film in the contact portion. What should be noted is that the etching rate of the DCS-SiN film formed at 780° C. by using dichlorosilane (DCS) as a raw material is 0.2 nm/min when etched with a dilute hydrofluoric acid (1/200) in contrast to about 1 nm/min for the native oxide film. Since the etching rate of the DCS-SiN film is low, the native oxide film fails to be removed in the etching step with the dilute hydrofluoric acid.

On the other hand, a high processing speed is required for a logic device, making it necessary to decrease the so-called "RC delay time", i.e., to decrease the capacitance between adjacent wirings and the wiring resistance. For decreasing the wiring resistance, use of copper for forming the metal wiring is being studied. For using a copper wiring, a barrier layer is required for preventing oxidation of the copper wiring and for preventing diffusion of copper within the copper wiring. Use of a SiN layer is now under study as one of the barrier layers.

FIG. 36 exemplifies a structure in which a SiN film is formed as a barrier layer on a Cu wiring. The structure shown in the drawing includes a TEOS oxide film 701, a TaN film 702, a Cu wiring 703 and a SiN film 704. Even in the case of employing the Cu wiring technology, an Al wiring is partly used in the narrow pitch portion between adjacent wirings in order to decrease the RC component between adjacent wirings. Therefore, it is necessary for the SiN film 704 to be formed in the subsequent step at a temperature not exceeding the Al reflowing temperature of 450° C. Also, the interlayer insulating film that is already formed in the step of forming the wiring is formed of a low permittivity film (generally called low-k film) such as a film of FSG (Fluorine-added Silicate Glass) in order to decrease the permittivity. Since these films are formed at a low temperature, i.e., not higher than 400° C., cracks tend to be generated at temperatures not lower than 450° C. Such being the situation, the SiN film 705 must be formed at low temperatures not higher than 450° C. In general, the SiN film 705 is formed by a plasma CVD which can be easily performed at low temperatures.

In a semiconductor device, the aspect ratio of the device element separating trench and the concave portion between gate electrodes tends to be increased in accordance with miniaturization of the device element. With increase in the aspect ratio, it gradually becomes difficult to bury an insulating film such as a silicon oxide film within the trench without forming a so-called "void".

Under the circumstances, use of an HDP (High-Density Plasma)-CVD method or a TEOS-$O_3$ series CVD method is being tried. However, the former method gives rise to problems such as a plasma damage done to the underlying layer, a nonuniformity in the film quality and a low throughput. Also, the latter method gives rise to the problem that a heat treatment at a high temperature is required for improving the film quality after the film formation.

BRIEF SUMMARY OF THE INVENTION

As described above, an LPCVD method using dichlorosilane as a Si raw material is proposed as a method for forming a silicon nitride film that is buried in a wiring trench.

However, a ratio in the polishing rate by CMP of the interlayer insulating film ($SiO_2$) to the silicon nitride film (DCS-SiN film) formed by this method is about 30. As a result, the DCS-SiN film is excessively etched in the step of removing by CMP the excess DCS-SiN film outside the wiring trench so as to increase the leakage current between the buried wiring and the lower capacitor electrode.

An object of the present invention, which has been achieved in view of the situation described above, is to provide a semiconductor device including a silicon nitride film having a step coverage substantially equal to that of the conventional silicon nitride film and exhibiting a sufficiently large selectivity ratio relative to a silicon oxide film, and a method of manufacturing the particular semiconductor device.

According to a first aspect of the present invention, there is provided a semiconductor device including a silicon nitride film having a chlorine concentration of at least $4 \times 10^{20}$ cm$^{-3}$.

According to a second aspect of the present invention, there is provided a method of manufacturing a semiconductor device, comprising the step of forming a silicon nitride film having a chlorine concentration of at least $4 \times 10^{20}$ cm$^{-3}$ by an LPCVD method using a compound having a Si—Si bond and a Si—Cl bond as a Si raw material.

Further, according to a third aspect of the present invention, there is provided a method of manufacturing a semiconductor device, comprising the steps of forming on a semiconductor substrate having a diffusion layer formed in a surface region thereof an insulating film having a wiring trench and a contact hole positioned below said wiring trench and connected to said diffusion layer; forming a barrier metal layer on the surface of said diffusion layer; forming a buried wiring filling the contact hole and also filling a lower portion of the wiring trench, said buried wiring being electrically connected to the diffusion layer; forming a silicon nitride film on the entire surface including the wiring trench in a manner to fill the upper portion of the wiring trench; and removing the silicon nitride film positioned outside the wiring trench.

The specific construction of the present invention is as follows:

(1) The silicon nitride film contains an excessive amount of silicon.

(2) The nitrogen/silicon ratio of the silicon nitride film is smaller than 1.33, which is smaller than the stoichiometric ratio of $Si_3N_4$.

(3) The silicon nitride film is formed inside the wiring trench having a high aspect ratio. Specifically, the aspect ratio of the wiring trench is not smaller than 1.

(4) The silicon nitride film having a chlorine concentration of at least $4 \times 10^{20}$ cm$^{-3}$ is formed by an LPCVD method using a compound having a Si—Si bond and a Si—Cl bond as a Si raw material. Specifically, the Si raw material is represented by $Si_nCl_{2n+2}$, where n is 2 or more, or $Si_nCl_{2n-2}H_x$, where n is 2 or more, and x is 2n+2 or less. Particularly, it is desirable to use $Si_2Cl_6$ as the Si raw material. Also, $NH_3$ is used as the nitrogen source.

(5) The chlorine concentration of the silicon nitride film can be set at $4\times10^{20}$ cm$^{-3}$ or more by forming the silicon nitride film at a temperature not higher than 700° C.

(6) A laminate structure consisting of a Ti film and a TiN film is used as a barrier metal film, and the film-forming temperature of the silicon nitride film is set at 700° C. or less. Also, the wiring trench has a high aspect ratio, i.e., not smaller than 1.

It has been found as a result of the research conducted by the present inventors that, if a compound having a Si—Si bond and a Si—Cl bond such as Si$_2$Cl$_6$ is used as the Si raw material in the LPCVD method for forming a silicon nitride film, it is possible to form a silicon nitride film exhibiting a selectivity ratio relative to a silicon oxide film in respect of the polishing and etching. Also, the step coverage remains unchanged because the LPCVD method satisfactory in step coverage is employed in the method of the present invention.

It has also been found that, in the case of using the Si raw material noted above, the silicon nitride film can be formed at a sufficiently high film-forming rate even if the film is formed at a low temperature not higher than 700° C., making it possible to use a laminate structure of Ti/TiN film as the barrier metal film. Also, the chlorine concentration of the silicon nitride film formed by using the Si raw material noted above at the film-forming temperature noted above has been found to be not lower than $4\times10^{20}$ cm$^{-3}$.

It should also be noted that, if the silicon nitride film is formed at a temperature not higher than 600° C., it is possible to obtain a silicon nitride film containing an excess silicon. The silicon nitride film of this kind is low in density and, thus, can be polished at a rate higher than that of the silicon oxide film.

As described above, the DCS-SiN film used as a RIE stopper is satisfactory in the step coverage and the etching selectivity. However, the etching rate of the DCS-SiN film is not high enough to be removed completely when etched with a dilute hydrofluoric acid in the step of removing the native oxide film. Also, in view of decrease of the capacitance between adjacent wirings, the DSC-SiN film gives rise to a problem that the permittivity of the DSC-SiN film is relatively large.

Incidentally, a plasma SiN film formed as a barrier film of the Cu wiring by a plasma CVD using silane (SiH$_4$) and ammonia (NH$_3$) as raw materials has a relatively large permittivity of about 7. Also, a plasma SiN film formed at 370° C. was subjected to a high temperature bias test under 100° C. and 1 MV/cm by using a Cu electrode. It has been found that the thickness of the SiN diffusion-oxidation barrier film relative to Cu, which is required for maintaining a sufficiently high insulation breakdown voltage, is about 100 nm. However, if a SiN film having such a large permittivity is formed in a thickness of 100 nm in the wiring portion, the capacitance between adjacent wirings is markedly increased so as to impair the device characteristics.

Another object of the present invention, which has been achieved in view of the situation described above, is to provide a semiconductor device including a silicon nitride film substantially equal to the prior art in the step coverage and the etching selectivity, low in permittivity, high in etching rate when etched with a dilute hydrofluoric acid, and used as an etching stopper film in etching a silicon oxide film, and a method of manufacturing the particular semiconductor device.

Another object of the present invention, which has been achieved in view of the situation described above, is to provide a semiconductor device including a silicon nitride film low in permittivity and used as a barrier film for Cu, and a method of manufacturing the particular semiconductor device.

To achieve these objects, the semiconductor device of the present invention is featured in that a silicon nitride film having a chlorine concentration of at least $1\times10^{21}$ cm$^{-3}$ is used as an etching stopper film or a barrier film.

Concerning the LPCVD method for forming a silicon nitride film, it has been found that, if a compound having a Si—Si bond and a Si—Cl bond such as Si$_2$Cl$_6$ is used as the Si raw material, it is possible to form a silicon nitride film exhibiting a sufficiently large etching selectivity relative to a silicon oxide film.

The chlorine concentration of the silicon nitride film formed by using the particular Si raw material has been found to be at least $1\times10^{21}$ cm$^{-3}$. Also, the step coverage has been found to be substantially equal to the prior art because an LPCVD method that permits achieving a good step coverage is employed in the method of the present invention. Further, in the case of using the particular Si raw material, it is possible to diminish the permittivity of the silicon nitride film, to increase the etching rate of the silicon nitride film when etched with a dilute hydrofluoric acid, and to improve the barrier properties of the silicon nitride film relative to Cu. These features of the present invention will be described hereinlater in detail in conjunction with the embodiments of the present invention.

As described above, it has become difficult to form a silicon nitride film excellent in burying properties in a concave portion having a high aspect ratio and in film characteristics in accordance with miniaturization of the device element.

Another object of the present invention is to provide a semiconductor device that permits forming a silicon nitride film excellent in burying properties and film characteristics in a concave portion having a high aspect ratio and a method of manufacturing the particular semiconductor device.

According to a fourth aspect of the present invention, which has been achieve in view of the situation described above, there is provided a method of manufacturing a semiconductor device, comprising the steps of forming a silicon nitride film over an entire region of a concave portion formed in an underlying layer region on the side of a main surface of a semiconductor substrate; and oxidizing said silicon nitride film to convert the silicon nitride film into a silicon oxide film so as to form an insulating region over the entire region within the concave portion.

According to a fifth aspect of the present invention, there is provided a method of manufacturing a semiconductor device, wherein an insulating region is formed over an entire region of a concave portion formed in an underlying region on the side of a main surface of a semiconductor substrate by repeating a plurality of times in a film-forming direction the steps of forming a silicon nitride film within said concave portion and oxidizing said silicon nitride film to convert the silicon nitride film into a silicon oxide film.

Preferred embodiments of the manufacturing method of the present invention are as follows:

(1) The silicon nitride film contains at least one of phosphorus and boron, and a silicon oxide film containing at least one of phosphorus and boron is formed by oxidizing the silicon nitride film.

(2) The silicon oxide film contains chlorine in an amount of at least $1\times10^{19}$ cm$^{-3}$.

(3) The silicon nitride film contains chlorine in an amount of at least $9\times10^{20}$ cm$^{-3}$. It is desirable for the silicon nitride film to have a density not higher than 2.4 g/cm$^3$ and a specific inductive capacity not larger than 7.3.

(4) The silicon nitride film is formed by an LPCVD method using a compound having a Si—Si bond and a Si—Cl bond as a raw material gas.

(5) The compound used in the LPCVD method is represented by $Si_nCl_{2n+2}$ or $Si_nCl_{2n+-x}H_x$, where n is an integer of 2 or more, and x is an integer smaller than 2n+2. A typical example of the particular compound is hexachlorodisilane.

(6) The silicon nitride film is formed at a temperature lower than 450° C.

The semiconductor device of the present invention is featured in that the device comprises an underlying region having a concave portion formed on the side of a main surface of the semiconductor substrate and a silicon oxide film containing chlorine, which is buried over the entire region of the concave portion of the underlying region.

In the present invention, a silicon nitride film, particularly, a silicon nitride film containing chlorine is oxidized for conversion into a silicon oxide film, with the result that a silicon oxide film is buried uniformly and homogeneously within the concave portion. It should also be noted that, even if the silicon nitride film includes a void, a silicon oxide film free from the void can be obtained because a volume expansion accompanies the conversion from the silicon nitride film into the silicon oxide film.

Further, since chlorine is contained in the silicon oxide film, the dangling bond present in the interface with another film can be terminated so as to decrease the leakage current.

Still further, the silicon oxide film containing chlorine is also allowed to contain at least one of phosphorus and boron so as to obtain additional effects that the gettering of impurities and selectivity ratio in the etching step are improved.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 7 is a graph showing the relationship between the forming rate of the HCD-SiN film and the film-forming temperature;

FIG. 8 shows the Silicon 2p states of silicon in an HCD-SiN film measured by photoelectron spectroscopy;

FIG. 22 show SIMS profiles of various device elements contained in the silicon oxide film of the present invention;

DETAILED DESCRIPTION OF THE INVENTION

Some embodiments of the present invention will now be described with reference to the accompanying drawings.
First Embodiment FIGS. 1A to 1F are cross sectional views collectively showing a method of manufacturing a semiconductor device according to a first embodiment of the present invention. These drawings show cross sections in a direction perpendicular to the longitudinal direction of the channel of a MOS transistor of a DRAM cell.

Figure 1A:
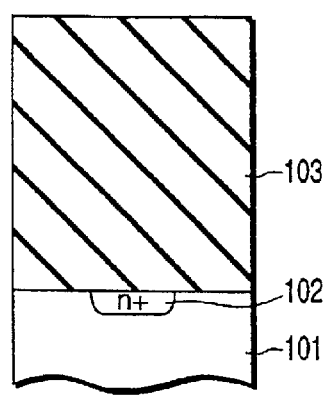
FIGS. 1A to 1F are cross sectional views collectively showing a method of manufacturing a semiconductor device according to each of first and second embodiments of the present invention.
Figure 1B:
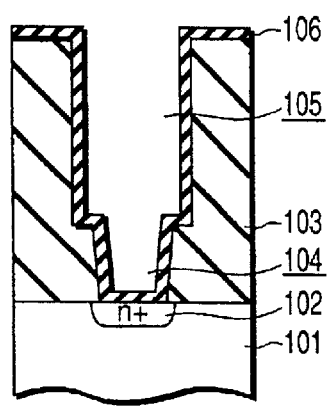
Figure 1C:
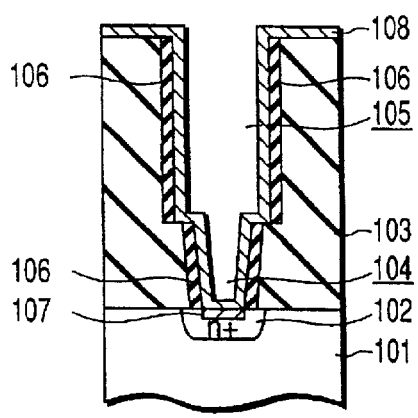

In the first step, an n-type drain diffusion layer 102, etc. are formed by a known method in a silicon substrate 101 to finish forming a MOS transistor, followed by forming an interlayer insulating film ($SiO_2$ film) 103 on the entire surface, as shown in FIG. 1A. Then, a contact hole 104 exposing the n-type drain diffusion layer 102 and a wiring trench 105 connected to the n-type drain diffusion layer 102 via the contact hole 104 are formed in the interlayer insulating film 103, followed by forming a silicon nitride film 106 over the entire surface, as shown in FIG. 1B. The silicon nitride film 106 thus formed is selectively removed by RIE (reactive ion etching) such that the silicon nitride film 106 is left unremoved on the side walls defining the contact hole 104 and the wiring layer 105, followed by forming a Ti layer 107 by ion implantation in the substrate surface on the bottom of the contact hole 104 and subsequently forming a TiN film 108 on the entire surface by a CVD method, as shown in FIG. 1C.

Figure 1D:
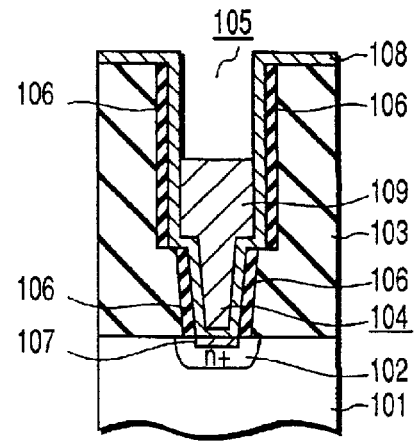

In the next step, the contact hole 104 and a lower portion of the wiring trench 105 are filled with a tungsten (W) layer by selective growth of W to form a buried wiring 109, as shown in FIG. 1D. The upper portion of the wiring trench 105 in which the buried wiring 109 of W is not formed has a depth of 150 nm and a width of 150 nm. In other words, the upper portion of the wiring trench 105 has an aspect ratio of 1.

The construction shown in FIG. 1D can also be obtained by forming a W film on the entire surface, followed by removing by CMP an excess W film outside the contact hole 104 and the wiring trench 105 and subsequently forming an additional interlayer insulating film ($SiO_2$) on the entire surface and forming an additional wiring trench in the additional interlayer insulating film in a manner to be positioned above the wiring trench 105.

The Ti layer 107 formed at the bottom of the contact hole 104 and the TiN film 108 act as barrier metal layers for preventing the reaction between the drain diffusion layer 102 and the buried W wiring 109 in the subsequent heat treating step.

It should be noted that the Ti layer 107 and the TiN film 108 are low in resistance to heat. If a heat treatment is applied at temperatures not lower than 700° C. for a long time, these Ti layer 107 and TiN film 108 fail to maintain their functions. It follows that it is necessary to form the silicon nitride film 106 at temperatures not higher than 700° C.

Figure 37:
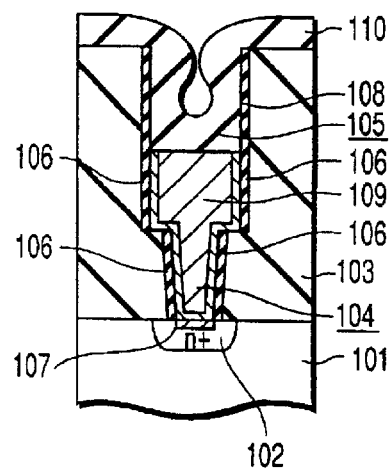
FIG. 37 is for explaining the reason why an LPCVD method is employed for forming a silicon nitride film.

The silicon nitride film 106 is formed by an LPCVD method. It should be noted in this connection that the silicon nitride film formed by the plasma CVD method is low in its step coverage, with the result that, if the aspect ratio of the wiring trench 105 is higher than 1.0, a clearance is formed in a central portion of the wiring trench 105, as shown in FIG. 37. It follows that the silicon nitride film formed by the plasma CVD method fails to ensure satisfactory insulating properties. The other reason for employment of the LPCVD method is that the silicon nitride film formed by the plasma CVD method is not resistant to etching under RIE conditions of silicon, resulting in failure for the silicon nitride film to perform the function of a mask.

Incidentally, where a mixed gas consisting of silane and ammonia is used as the raw material gas, the resultant silicon nitride film is low in its step coverage even if the film is formed by the LPCVD method. In addition, the silicon nitride film is low in uniformity over the entire region of the wafer. On the other hand, in the case of using a Si raw material having chlorine substituted for hydrogen such as dichlorosilane or tetrachlorosilane, a silicon nitride film having a high step coverage can be obtained. As a matter of fact, it is possible to achieve 100% of the step coverage, even if the wiring trench has an aspect ratio of about 20. However, the difficulties already described in conjunction with the prior art remain unsolved in the LPCVD method using the raw material gas of this kind.

Figure 1E:
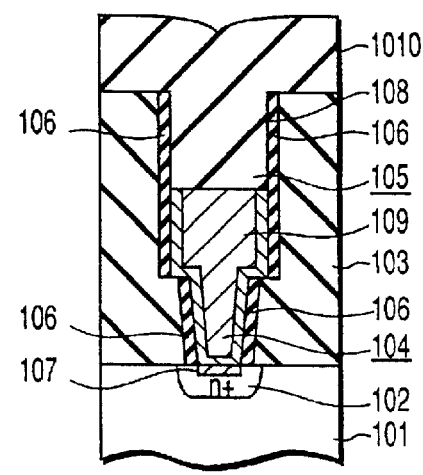

In the next step, the TiN film 108 positioned above the buried wiring 109 of W is removed by a wet etching, followed by forming by an LPCVD method using a mixed gas consisting of $Si_2Cl_6$ (hexachlorodisilane: HCD) and $NH_3$ a silicon nitride film (HCD-SiN film) 110 acting as a cap insulating film on the entire surface in a manner to fill the inner space of the wiring trench 105, as shown in FIG. 1E. The silicon nitride film 110 is formed under the temperature of 650° C., the reactor inner pressure of 0.5 Torr and the $NH_3/Si_2Cl_6$ flow rate ratio of 2000/20. Under these conditions, the silicon nitride film 110 is formed at a rate of 2.7 nm/min.

Figure 1F:
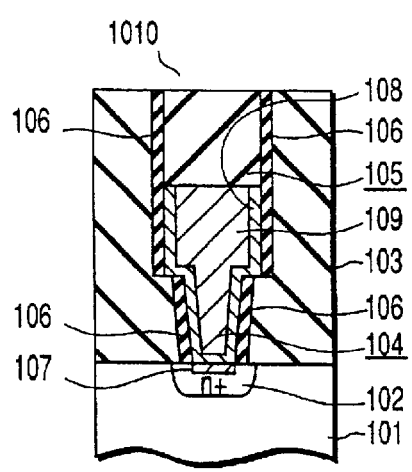

Finally, the excess HCD-SiN film 110 is removed by CMP to make the surface flat, as shown in FIG. 1F, followed by forming by a known method a lower capacitor electrode (not shown), a capacitor insulating film (not shown) and an upper capacitor electrode (not shown) so as to finish preparation of a DRAM memory cell.

It is desirable to use an insulating film consisting of a metal oxide having a high permittivity such as $Ba_xSr_{1-x}TiO_3$ as the capacitor insulating film. On the other hand, it is desirable to use a conductive film consisting of a metal oxide, which exhibits a conductivity even if oxidized, such as $SrRuO_3$ for forming each of the lower and upper capacitor electrodes. It is also desirable for the capacitor insulating film and upper and lower capacitor electrodes to have the same crystal structure, e.g., perovskite structure.

The slurry used in the CMP step should consist of small silica particles, 2.5% by weight of phosphoric acid and water. Also, the load of the polishing pad should be 200 gf.

The thickness of the wafer after the CMP treatment was measured at 9 points within the wafer surface to obtain the average thickness of the wafer, thereby determining the polishing rate of the silicon nitride film. The polishing rate of the HCD-SiN film 110 was found to be about 90 nm/min in contrast to only about 60 nm/min for the conventional silicon nitride film of DCS-SiN film. In other words, the first embodiment of the present invention permits increasing the selectivity ratio (polishing rate of silicon nitride film/ polishing rate of silicon oxide film) from the conventional value 30 to 45.

Since the polishing ratio is large, the polishing of the HCD-SiN film 110 by CMP is substantially stopped at the interlayer insulating film 103. Although the interlayer insulating film 103 may be somewhat removed, an over-polishing does not take place to expose the buried W wiring 109 to the outside. It follows that it is possible to realize the buried shape and flatness as designed.

Also, in the first embodiment of the present invention, it is possible to obtain a high step coverage equivalent to that of the conventional DCS-SiN film. The reasons for the high step coverage in the first embodiment are considered to reside in that an LPCVD method is employed as a film-forming method, making it possible to fill uniformly the inner space of the wiring trench 106, and that the adsorption probability of the reaction intermediate of the chloride such as $Si_2Cl_6$ (chloride of disilane) used as the Si raw material in the first embodiment is lower than that of the complete hydride.

Figure 2:
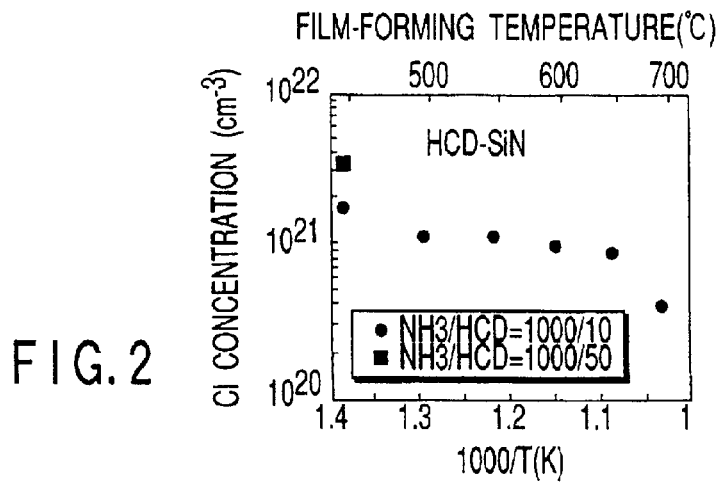
FIG. 2 is a graph showing the relationship between the chlorine concentration in a silicon nitride film (HCD-SiN film) of the present invention and the film-forming temperature.

FIG. 2 is a graph showing changes with temperature in the chlorine concentration of the silicon nitride film (HCD-SiN film) formed by an LPCVD method using $Si_2Cl_6$ as the Si raw material. Incidentally, the chlorine concentration was found to be $8 \times 10^{19}$ in the silicon nitride film (DCS-SiN film) formed by an LPCVD method at 700° C. using dichlorosilane as the Si raw material, though this case is not shown in the graph of FIG. 2. The chlorine concentration was determined by a secondary ion mass spectroscopy (SIMS).

The film-forming temperature was set at 650° C. in the first embodiment. However, since FIG. 2 indicates that the chlorine concentration is linearly decreased in a region where 1000/T is about 1.1 or less in the case of using $Si_2Cl_6$ as the Si raw material, it is considered reasonable to understand that, if the firm-forming temperature is set at 800° C. or less, it is possible to form the silicon nitride film 110 having a chlorine concentration higher than that in the case of using the conventional Si raw material of dichlorosilane. It should be noted, however, that, in the case of forming the silicon nitride film 10 in the buried wiring portion as in the first embodiment of the present invention, it is desirable to perform the film formation at 700° C. or less because the Ti film 7 and the TiN film 8 are incapable of resisting the heat of temperatures higher than 700° C.

The chlorine concentration of the HCD-SiN film higher than that of the DCS-SiN film is considered to be brought about by mainly two factors given below. First of all, the film-forming rate of the HCD-SiN film is higher than that of the DCS-SiN film. Naturally, the HCD-SiN film can be formed in a shorter time than the DCS-SiN film under the same film-forming conditions including the temperature, with the result that the amount of chlorine lost from the film during the film formation is suppressed. The difference in the film-forming rate between the HCD-SiN film and the DCS-SiN film is considered to be brought about because the dissociation of the Si—Si bond is advantageous for the film formation.

When it comes to the bond energy, the Si—Cl bond has a bond energy of 4.16 eV, which is the highest bond energy among the bonds conceivable in the case of using the HCD+$NH_3$ system. If the same number of chlorine atoms are supposed to be attached to the surfaces of the DCS-SiN film and the HCD-SiN film in the film forming step, the Si—Cl bonds that are unlikely to be cut away are included in a larger amount in the HCD-SiN film having a higher film-forming rate.

The second reason for the high chlorine concentration in the HCD-SiN film is that the HCD-SiN film can be formed at a lower temperature. As shown in FIG. 2, the chlorine concentration is increased with decrease in the film-forming temperature. Also, where the film-forming temperature is lower than 450° C., the chlorine concentration is high under the condition of a higher film-forming rate, i.e., $NH_3$/HCD= 1000/50.

Figure 3:
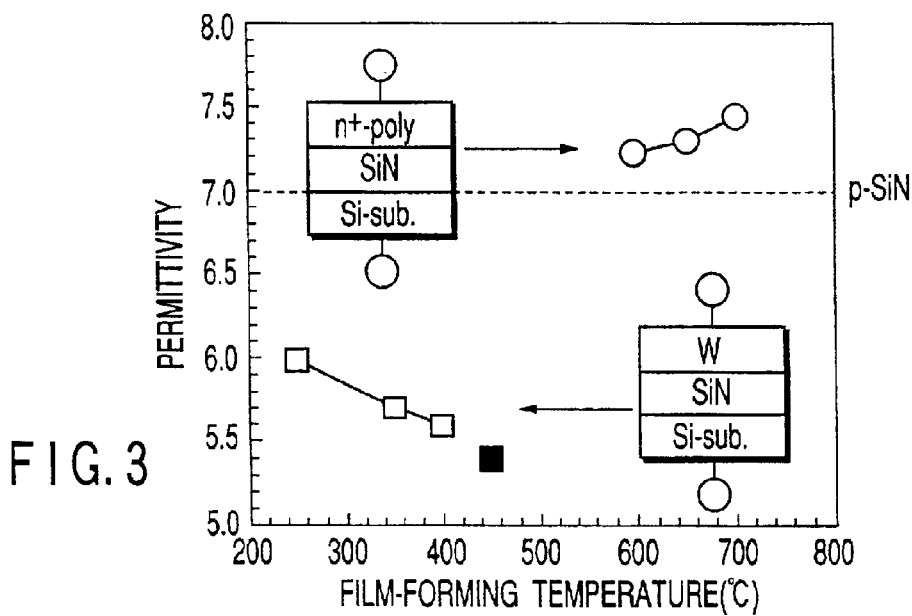
FIG. 3 is a graph showing the relationship between the permittivity of the HCD-SiN film and the film-forming temperature.

FIG. 3 is a graph showing the changes with the film-forming temperature in the permittivity of the HCD-SiN film determined by the C-V measurement. The white square marks □ in the graph represent that ammonia and HCD were used as the raw materials. The black square marks ■ in the graph represent the case where a nitrogen gas ($N_2$) was added to the raw materials of ammonia and HCD during the film-formation.

As apparent from the graph of FIG. 3, the permittivity of the HCD-SiN film was lower than the permittivity (=7.8) of the ordinary silicon nitride film ($Si_3N_4$) under the film-forming temperature not higher than 700° C. For example, the permittivity of the HCD-SiN film formed at 450° C., which is denoted by the black square ■, is smaller by 20 to 30% than that of P-CVD-SiN film denoted by dotted lines in the graph. Also, the permittivity of the HCD-SiN film formed at 450° C., which is denoted by the black square ■, is small, i.e., 5.4, compared with that (7.3) of the HCD-SiN films formed at 550° C. to 700° C. under the ammonia flow rate R of 100 sccm and a pressure of 0.5 Torr, which are denoted by white circles ○. Further, the white squares □ represent HCD-SiN films formed under the ammonia flow rate 100 and a pressure of 1.4 Torr. Also, the permittivity of the HCD-SiN film under the film-forming temperature not higher than 450° C. was very low, i.e., not larger than 6, which is smaller than the permittivity (=about 7) of a plasma-silicon nitride film (p-SiN). Since the permittivity is small, the wiring capacitance can be markedly decreased, which is highly advantageous in the case where the HCD-SiN film is used as an insulating film in a so-called "multi-layered wiring" portion. Also, in this experiment, the samples used in the film formation under 600° C. or more were different from the samples used in the film formation under 450° C. or less. However, similar results were obtained in the case of using the same samples. Incidentally, a nitrogen gas was not allowed to flow during formation of the HCD-SiN films shown in FIG. 3. However, an appreciable difference in the permittivity of the HCD-SiN film is not recognized even if the film is formed under the nitrogen gas stream.

Figure 4:
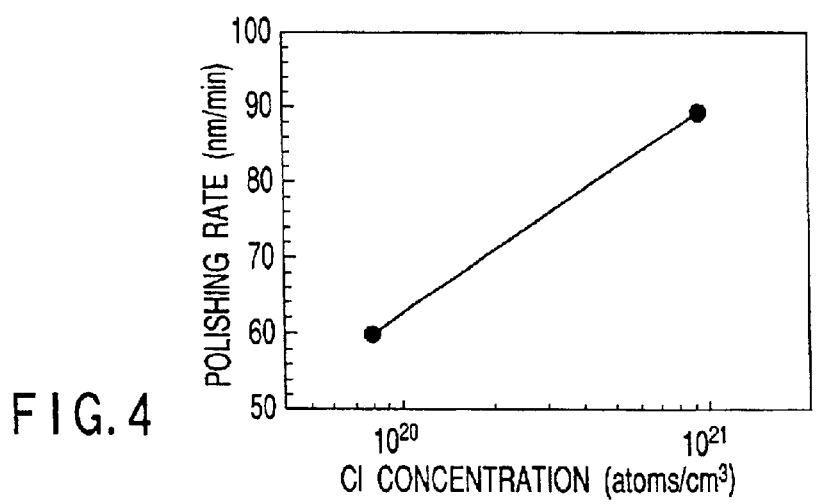
FIG. 4 is a graph showing the relationship between the chlorine concentration in a silicon nitride film and a polishing rate.

FIG. 4 is a graph showing the relationship between the chlorine concentration in the silicon nitride film and the polishing rate. As apparent from the graph, the polishing rate is increased in proportion to the chlorine concentration. The reason for the particular phenomenon is considered to reside in that a large number of chlorine ions having a large radius of ion are contained in the network consisting of Si—N so as to disturb the network. In other words, a high chlorine concentration permits forming a silicon nitride film of a low density, leading to a high polishing rate by CMP.

Figure 5A:
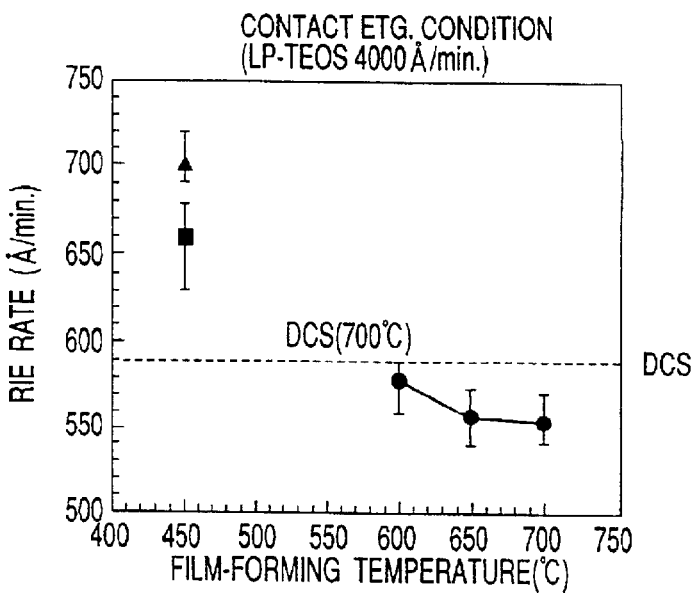
FIG. 5A is a graph showing the relationship between the RIE rate of the HCD-SiN film and the film-forming temperature.
Figure 5B:
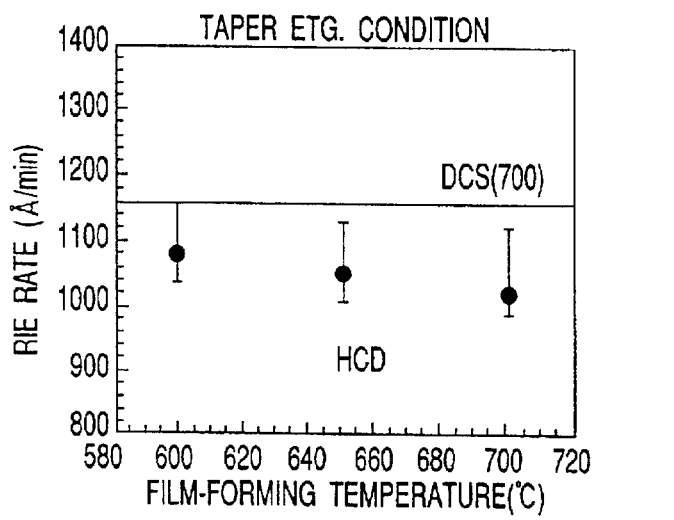
FIG. 5B is a graph showing the RIE rate in the case of forming the DCS-SiN film at 700° C.

The above description covers the case where the silicon nitride film is removed by CMP. Where RIE is employed for removing the silicon nitride film, the etching rate of the silicon nitride film was found to be as shown in FIGS. 5A and 5B. Specifically, the HCD-SiN film was found to be lower in the etching rate than the DCS-SiN film formed at 700° C. regardless of the film-forming temperature, as shown in the drawings. It follows that the HCD-SiN film 110 in the first embodiment is adapted for use as a mask in the step of forming by RIE the contact hole for connecting the lower capacitor electrode to the n$^+$-type source diffusion layer 102 in the interlayer insulating film 103, compared with the conventional DCS-SiN film. Incidentally, FIG. 5A shows the results under the etching conditions for forming the opening of the contact hole, with FIG. 5B showing the results under the etching conditions for the tapered processing.

Figure 6:
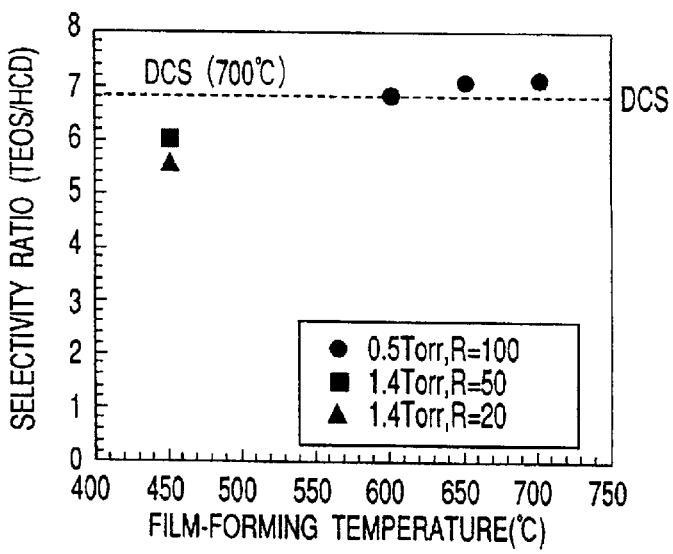
FIG. 6 is a graph showing the relationship among the RIE selectivity ratio of a TEOS film to an HCD-SiN film, the film-forming temperature and the ammonia flow rate.

FIG. 6 is a graph showing the relationship among the RIE selectivity ratio of the TEOS oxide film to the HCD-SiN film, i.e., etching rate of TEOS oxide film/etching rate of HCD-SiN film, the film-forming temperature and the ammonia flow rate R. The RIE selectivity ratio of the TEOS oxide film to the DCS-SiN film formed at 700° C. is also shown in the graph of FIG. 6. Line indicated in the figure shows the RIE rate of DCS-SiN formed at 700° C., the black circles ● the graph represent HCD-SiN films formed under a pressure of 0.5 Torr, an ammonia/HCD flow rate ratio R of 100, and temperatures of 600° C., 650° C. and 700° C. As shown in the graph, the etching selectivity ratio was found to be about 7 in each of these cases. On the other hand, the blacks square ■ and black triangle ▲ in the graph represent HCD-SiN films formed under a pressure of 1.4 Torr and ammonia/HCD flow rate ratios R of 50 and 20, respectively. In each of these cases, the selectivity ratio was found to be about 6, though these films were formed at a low temperature of 450° C. As apparent from the graph, RIE permits obtaining a selectivity ratio substantially equal to that of DCS-SiN film regardless of the ammonia flow rate R and the film-forming temperature.

FIG. 7 is a graph showing the relationship between the film-forming rate of the HCD-SiN film and the film-forming temperature. As apparent from the graph, a sufficiently high film-forming rate can be obtained even at a film-forming temperature of 250° C. in the case of the HCD-SiN film. It follows that, if the silicon nitride film 10 is formed at 650° C. as in the first embodiment of the present invention, it is possible to ensure a sufficiently high film-forming rate of the silicon nitride film 10 without loosing the function of the TiN film 8 as a barrier metal film.

Also, in the first embodiment of the present invention, a silicon nitride film is formed to fill the inner space of the wiring trench 5 having a buried wiring formed in the lower portion. It is also effective to form a silicon nitride film in a manner to fill a trench formed in a semiconductor device of the next era, e.g., a trench having a film of various laminate structures formed in a lower portion. To be more specific, it is possible to form a silicon nitride film in a manner to fill a trench formed in a silicon oxide film and having a laminated film of oxynitride film/polysilicon film/tungsten film (polymetal gate) formed in a lower portion.

Further, in the first embodiment, $Si_2Cl_6$ is used as the Si raw material. In the case of forming a silicon nitride film having a high chlorine concentration, the similar effect can be obtained by using a chloride having at least one Si—Si bond such as $Si_3Cl_8$ and $Si_4Cl_{10}$ and a Si raw material such as $Si_nCl_{2n+2}$, where n is not smaller than 2.

Second Embodiment

The first embodiment is directed to formation of a silicon nitride film having a high chlorine concentration. On the other hand, the second embodiment is directed to formation of a silicon nitride film having a high chlorine concentration and containing an excess silicon. FIGS. 1A to 1F will also be used for describing the second embodiment.

The second embodiment is equal to the first embodiment up to the step shown in FIG. 1D. Then, a silicon nitride film (HCD-SiN film) 10 is formed on the entire surface in a manner to fill the inner space of the wiring trench 6 by an LPCVD method using a mixed gas consisting of $Si_2Cl_6$ and $NH_3$, as shown in FIG. 1E. The silicon nitride film 10 is formed at a temperature of 600° C., a reactor inner pressure of 0.5 Torr, and a $NH_3/Si_2Cl_6$ flow rate ratio of 2000 sccm/20 sccm. The film-forming rate is 1.4 nm/min.

In the next step, the excess HCD-SiN film 10 outside the wiring trench 6 is removed by CMP under the conditions equal to those in the first embodiment so as to flatten the surface, as shown in FIG. 1F.

The film thickness after the CMP step indicated that the polishing rate of the HCD-SiN film 10 formed in the second embodiment was higher than that of the DCS-SiN film formed by the conventional method using dichlorosilane as the Si raw material. Since the second embodiment permits improving the polishing rate, it is possible to achieve a large selectivity ratio of the HCD-SiN film 10 relative to the silicon oxide film, making it possible for the polishing of the silicon nitride film by CMP to be stopped by the silicon oxide film. As a result, an excess polishing of the silicon nitride film can be suppressed, a buried shape as designed can be achieved, and processing of a high flatness can be performed.

The bonding state of silicon atoms within the silicon nitride films formed by changing the film-forming temperatures in the method of the second embodiment of the present invention was examined by the surface analysis by X-ray photoelectron spectroscopy (XPS). FIG. 8 shows the results. As apparent from FIG. 8, a silicon nitride film having Si—N bonds can be formed in the second embodiment of the present invention even if the film-forming temperature is changed.

Figure 9:
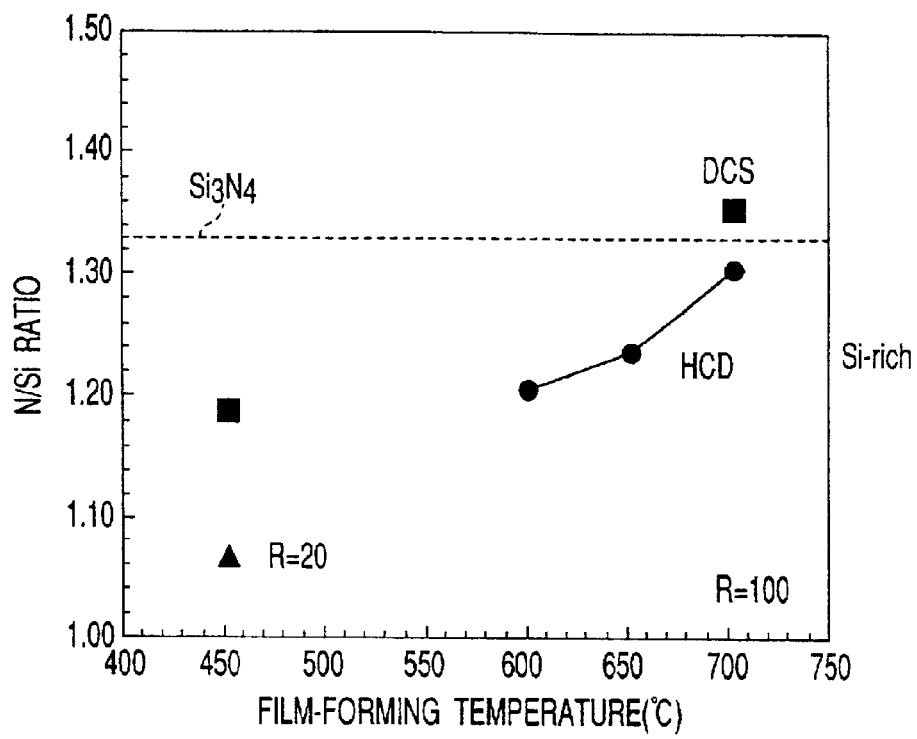
FIG. 9 shows the results of chemical analysis of N/Si ratio in silicon nitride films formed by changing the film-forming temperature in the second embodiment of the present invention.

FIG. 9 is a graph showing the result of chemical analysis in respect of the N/Si ratio in silicon nitride films formed at various temperatures by the second embodiment of the present invention. As apparent from the graph, it is possible to form a silicon nitride film (HCD-SiN film) having an excess silicon, i.e., N/Si≦1.33, compared with silicon nitride ($Si_3N_4$) film having a stoichiometric ratio, if the film-forming temperature is not higher than 700° C. The graph also shows that the HCD-SiN film is rich in silicon, compared with the conventional DCS-silicon nitride film.

The distance of Si—Si bond is 0.225 nm, which is longer than the distance of Si—N bond of 0.157 nm. Therefore, if a silicon nitride film having an excess silicon is formed, the network consisting of Si—N bonds is considered to be greatly disturbed. In other words, the silicon nitride film having an excess silicon has a lower density and, thus, the polishing rate is increased when polished by CMP. Also, the chlorine concentration in the film is increased, as shown in FIG. 2.

Figure 10:
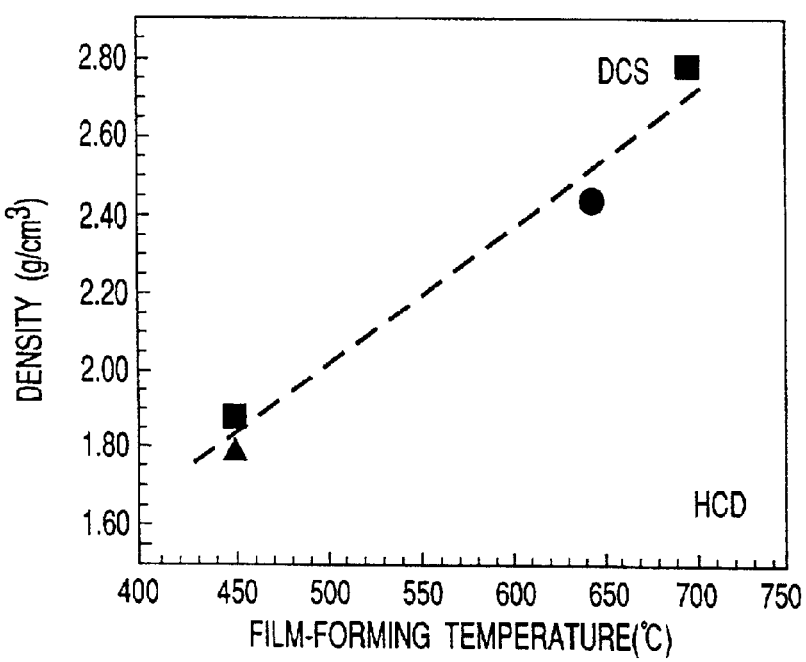
FIG. 10 shows the density of the HCD-SiN film formed by changing the film-forming temperature in the second embodiment of the present invention and the density of the DCS-SiN film formed at 700° C.

FIG. 10 is a graph showing the densities of the HCD-SiN films formed at various temperatures by the method of the second embodiment and the density of the conventional DSC-SiN film formed at 700° C.

The density was measured as follows. Specifically, the surface of the silicon nitride film other than the region that was to be dissolved in a DHF solution was covered with an HF-resistant tape. Then, the silicon nitride film in the uncovered region, sized at 6 cm×6 cm, was dissolved in the DHF solution, followed by weighing the silicon and nitrogen within the DHF solution so as to determine the density.

The black square in FIG. 10 at the film-forming temperature of 700° C. represents the conventional DCS-SiN film, with the other three points representing the HCD-SiN films formed by the second embodiment of the present invention. The ammonia flow rate R was 10 for the DSC-SiN film and 100 for each of the HCD-SiN films of the present invention.

As apparent from FIG. 10, the density of the HCD-SiN film is lowered with decrease in the film-forming temperature. Unlike the DSC-SiN film, the HCD-SiN film does not exhibit a prominent decrease in the film-forming rate even if the film-forming temperature is lower than 700° C., making it possible to form the HCD-SiN film in a practical film-forming time. It follows that an HCD-SiN film having a density lower than that of the DCS-SiN film can be obtained easily by lowering the film-forming temperature.

Further, a silicon nitride film having an excess silicon can be formed under a film-forming temperature of 700° C. and a reactor inner pressure of 0.5 Torr by lowering the $NH_3/Si_2Cl_6$ flow rate ratio to 10 or less. It should be noted, however, that the conductivity of the film is increased if the film has an excess silicon. Therefore, if the flow rate ratio is excessively lowered, the resultant silicon nitride film fails to maintain insulating properties. It follows that it is necessary to set the $NH_3/Si_2Cl_6$ flow rate ratio to meet the desired properties of the resultant silicon nitride film.

Further, in the second embodiment, $Si_2Cl_6$ is used as the Si raw material. In the case of forming a silicon nitride film having a high chlorine concentration and an excess silicon, the similar effect can be obtained by using a chloride having at least one Si—Si bond such as $Si_3Cl_8$ and $Si_4Cl_{10}$ and a Si raw material such as $Si_nCl_{2n+2}$, where n is not smaller than 2.

Third Embodiment

With progress in miniaturization of the device element, it is necessary to decrease the resistance of the gate electrode. Therefore, it is necessary in the next era to change the polymetal gate structure employed nowadays into a metal gate electrode. On the other hand, since it is difficult to achieve fine processing of a metal film by etching, a damascene gate process (A. Yagishita, et al., IEDM Tech. Digest, 1998: p. 785) is employed for forming a metal gate electrode. Also, a dummy gate is required for forming a trench in which the metal gate electrode is buried. A method of manufacturing a MOS transistor by using a metal gate electrode according to a third embodiment of the present invention will now be described with reference to FIGS. 11A to 11I.

Figure 11A:
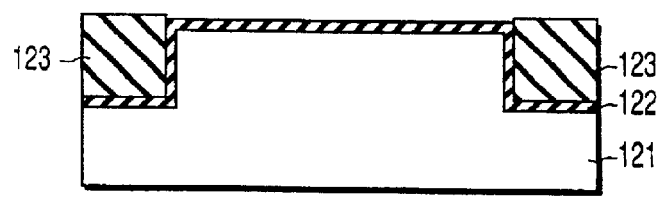
FIGS. 11A to 11I are cross sectional views collectively showing a former part of a method of manufacturing a MOS transistor according to a third embodiment of the present invention.

In the first step, a shallow trench is formed in a surface region of a silicon substrate 121, followed by forming a thermal oxide film 122 on the entire surface and subsequently burying a device element separating insulating film 123 within the shallow trench so as to achieve a device element isolation by STI (Shallow Trench Isolation), as shown in FIG. 11A. The device element isolating insulating film 123 is an oxide film formed by using TEOS as a raw material.

Figure 11B:
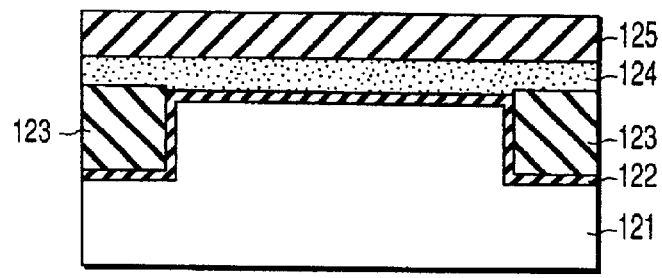

Then, a polycrystalline silicon (polysilicon) film 124 is formed on the entire surface in a thickness of 150 nm by an LPCVD method under the ordinary conditions, as shown in FIG. 11B. After formation of the polysilicon film 124, an HCD-SiN film 125 is formed in a thickness of 150 nm on the polysilicon film 124 by an LPCVD method under a temperature of 550° C. and a pressure of 1.4 Torr. In forming the HCD-SiN film 125, $Si_2Cl_6$ and $NH_3$ are used as the raw material gases. The flow rate ratio of $NH_3/Si_2Cl_6$ should be set at 1000/10.

In the third embodiment of the present invention, the HCD-SiN film 125 is formed at a low temperature, i.e., 500° C. On the other hand, the conventional DCS-SiN film is formed at such a high temperature as 700 to 780° C.

Under the film-forming conditions (flow rate ratio of raw material gases, film-forming temperature, and film-forming pressure) described above, the film-forming rate is 1.5 nm/min and, thus, the film-forming time is 100 minutes. It is possible to further increase the film-forming rate by increasing the partial pressure ratio of $Si_2Cl_6$, e.g., by increasing the total pressure or by decreasing the $NH_3$ flow rate.

Figure 11C:
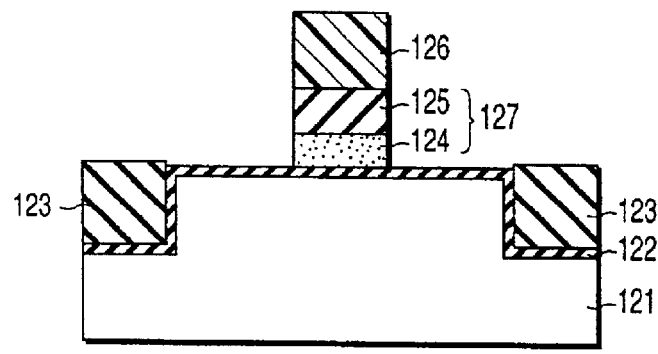

In the next step, a resist pattern 126 is formed by photolithography or EB depiction as shown in FIG. 11C, followed by removing by RIE the HCD-SiN film 125 and the polysilicon film 124 using the resist pattern 126 as a mask, thereby forming a dummy gate 127 of a laminate structure consisting of the HCD-SiN film 125 and the polysilicon film 124. Then, the resist pattern 126 is peeled off.

Figure 11D:
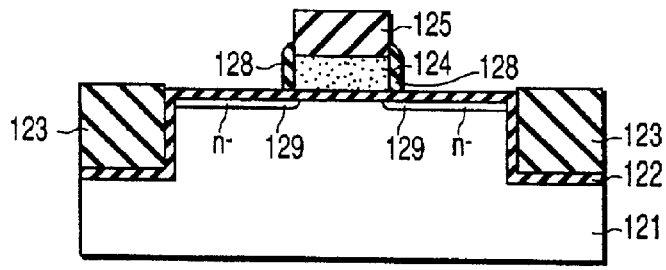

After formation of the dummy gate 127, an oxide film 128 is formed by thermal oxidation in a thickness of about 6 nm, as shown in FIG. 11D, followed by forming a shallow diffusion layer (LDD) 129 by introducing a low concentration of an impurity by ion implantation using the HCD-SiN film 125 as a mask. Where the diffusion layer 129 has an n-type conductivity, the diffusion layer 129 is formed by implanting, for example, As ions under an accelerating energy of 1 keV at a dose of $3\times10^{14}$ cm$^{-2}$.

Figure 11E:
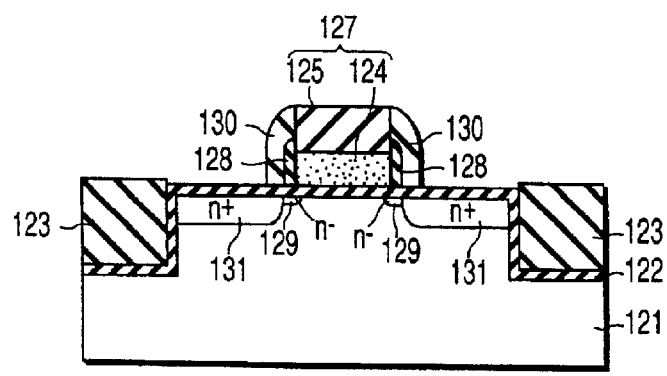

In the next step, a DCS-SiN film is formed in a thickness of 70 nm on the entire surface by an LPCVD method using the conventional raw material of dichlorosilane, followed by selectively removing the DCS-SiN film by RIE so as to form a gate side wall DCS-SiN film 130, as shown in FIG. 11E. The DCS-SiN film is formed at a temperature of, for example, 700° C., a pressure of 0.5 Torr, and a $NH_3/SiH_2Cl_2$ flow rate ratio of 500/50.

Then, source/drain diffusion layers 131 having a high impurity concentration is formed by ion implantation using the gate side wall DCS-SiN film 130 and the HCD-SiN film 125 as a mask. Where the source/drain diffusion layers have an n-type conductivity, impurity ions, e.g., As ions, are implanted under an accelerating energy of 45 keV and at a dose of $3\times10^{15}$ cm$^{-2}$.

It is possible to perform the annealing treatment for activating the impurities contained in the shallow diffusion layer 129 and the source/drain diffusion layer 131 every time the impurity ions are implanted. It is also possible to perform the annealing treatment after completion of all of the ion implantation treatments.

Figure 11F:
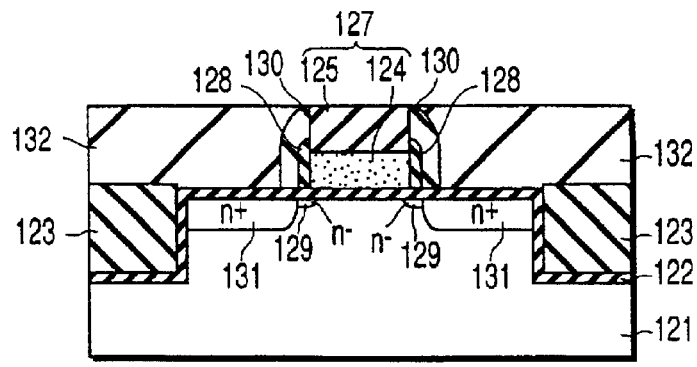

Further, an interlayer insulating film 132 is formed on the entire surface in a thickness of All about 350 nm by an LPCVD method using TEOS series raw material, as shown in FIG. 11F, followed by polishing the interlayer insulating film 132 by a CMP method to flatten the surface. In this step, the HCD-SiN film 125 acts as a CMP stopper.

Figure 11G:
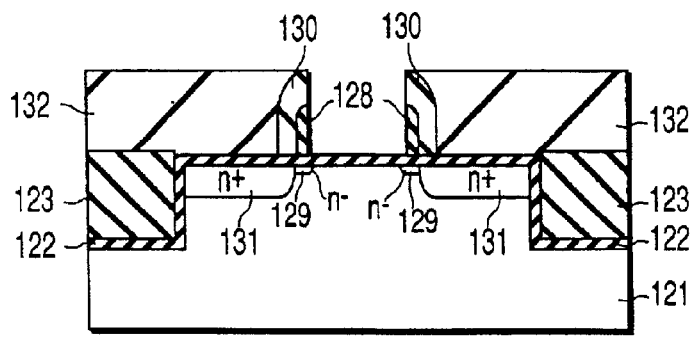

In the next step, the HCD-SiN film 125 is selectively removed by using a hot phosphoric acid solution of 160° C., followed by removing the polysilicon film 124 by a CDE method and subsequently removing the underlying thermal oxide film 122 by using a dilute hydrofluoric acid, as shown in FIG. 11G.

In this embodiment, the dummy gate 127 is formed of the HCD-SiN film 125, and the gate side wall DCS-SiN film 130 is used as the gate side wall insulating film. Therefore, the wet etching selectivity ratio of the gate side wall DCS-SiN film 130 can be set at a large value relative to the HCD-SiN film 125 by controlling the film-forming temperature, as described herein later.

It is important for the gate side wall insulating film to exhibit a large wet etching selectivity ratio relative to the silicon nitride film constituting the dummy gate 127. It should be noted in this connection that, if the dummy gate 127 and the gate side wall insulating film are etched simultaneously, the silicon substrate 121 is damaged in the step of removing the polysilicon film 124 by the CDE method. In the worst case, the silicon substrate 121 is polished.

Figure 12:
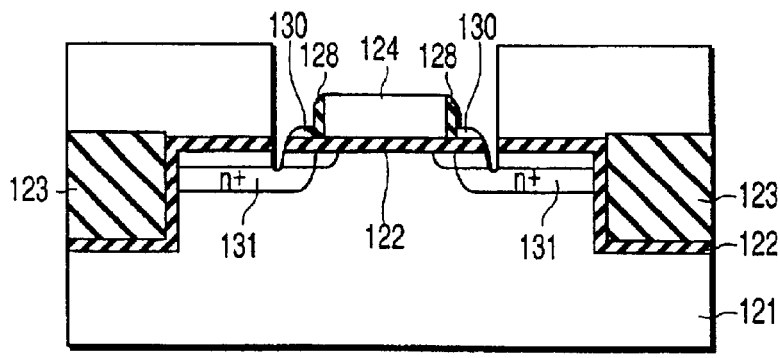
FIG. 12 is a cross sectional view corresponding to the cross sectional view shown in FIG. 11G, covering the case where a dummy gate and a gate side wall insulating film are formed by using the conventional technique alone.

FIG. 12 is a cross sectional view corresponding to the cross sectional view shown in FIG. 11G, covering the case where the dummy gate 127 and the gate side wall insulating film are formed by using the conventional technology alone. As shown in FIG. 12, a problem that the silicon substrate 121 is polished is brought about in the case of employing the conventional technology alone. In order to prevent the problem, it is necessary to provide a sufficiently large difference in etching rate between the dummy gate and the gate side wall insulating film relative to a chemical solution used for the processing as in the third embodiment of the present invention.

Figure 13:
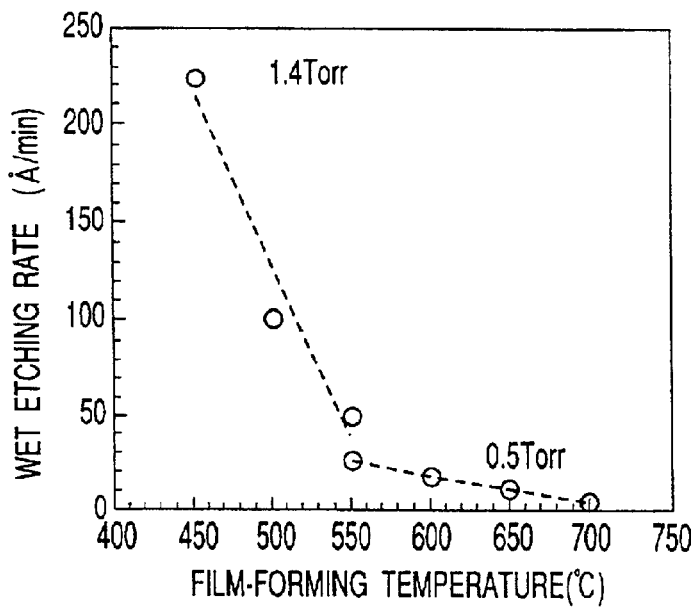
FIG. 13 is a graph showing the relationship between the etching rate, in the etching with a dilute hydrofluoric acid, of a silicon nitride film formed by using hexachlorodisilane and the film-forming temperature.

FIG. 13 is a graph showing the relationship between the etching rate of the silicon nitride film (HCD-SiN film) formed by using hexachlorodisilane and the film-forming temperature when the silicon nitride film is etched with a dilute hydrofluoric acid (water:HF=200:1). Where the film-forming temperature was not higher than 550° C., the film was formed under a pressure of 1.4 Torr in order to shorten the time required for forming the sample of HCD-SiN film. As apparent from the graph, the etching rate was increased with decrease in the film-forming temperature. The graph also shows that the etching rate of the DCS-SiN film formed at 700° C. was 0.19 nm/min when etched with a dilute hydrofluoric acid (water:HF=200:1). It follows that the etching selectivity ratios of the HCD-SiN films formed at 600° C. and 450° C. were 1.6 and 119, respectively, relative to the DCS-SiN film formed at 700° C. Also, the etching selectivity ratio of the HCD-SiN film formed at 550° C. as in the third embodiment was found to be 24.

Where a hot phosphoric acid is used as an etchant, it is known to the art that the etching selectivity ratio of the HCD-SiN film formed at 650° C. to the DCS-SiN film formed at 700° C. is 3.7. In other words, the tendency that the etching rate is increased with decrease in the film-forming temperature, which is observed in the case of using a dilute hydrofluoric acid as an etchant, is also considered to take place in the case of using a hot phosphoric acid as an etchant.

Figure 14:
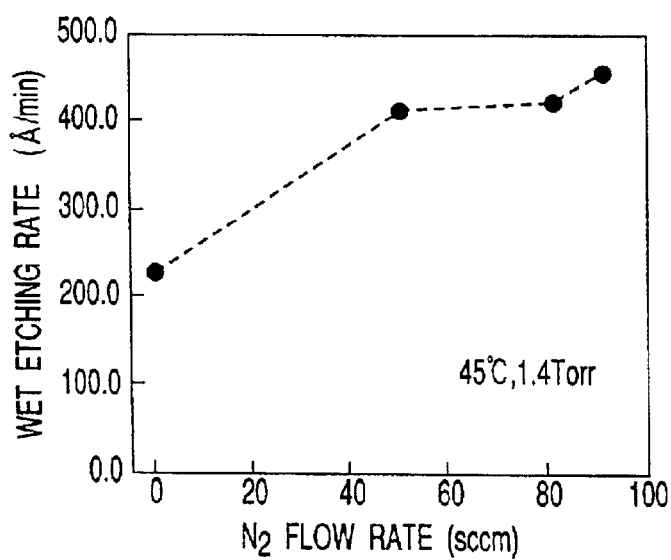
FIG. 14 is a graph showing the relationship between the flow rate of nitrogen gas that is allowed to flow during formation of a silicon nitride film using $Si_2Cl_6$ as a Si raw material and the wet etching rate of the silicon nitride film.

FIG. 14 is a graph showing the relationship between the wet etching rate and the $N_2$ flow rate. As shown in the graph, the etching rate of the silicon nitride film formed in the presence of a nitrogen gas ($N_2$) stream is about twice as high as that of the silicon nitride film formed without using a nitrogen gas stream in the case of using $Si_2Cl_6$ as the Si raw material. The etching rate shown in FIG. 14 indicates that the etching selectivity ratio of the HCD-SiN film formed in the presence of a nitrogen gas stream is about 240 relative to the DCS-SiN film formed at 700° C. Similar effects are considered to be produced in respect of the DCS-SiN films formed at different temperatures. It follows that the wet etching rates of the HCD-SiN film and the DCS-SiN film can be controlled by controlling the film-forming temperatures, making it possible to achieve a large etching selectivity ratio.

As described above, a large wet etching selectivity ratio can be provided by using the HCD-SiN film of the present invention for the silicon nitride film of the dummy gate and the conventional DCS-SiN film for the gate side wall insulating film.

In this fashion, the reduction in the thickness of the gate side wall DCS-SiN film can be effectively suppressed in the step of removing the polysilicon film 124 by the CDE process. As a result, the substrate is not damaged in the CDE process. Also, since the polysilicon film 124 and the HCD-SiN film 125 can be etched appropriately, the dummy gate 127 can be removed easily.

In the third embodiment of the present invention, a laminate structure consisting of the polysilicon film 124 and the HCD-SiN film 125 is used as the dummy gate 127 as in the prior art. It should be noted that the polysilicon film 124 serves to suppress without fail the etching of the gate side wall DCS-SiN film 130 in the step of etching the HCD-SiN film 125. However, the polysilicon film 124 need not be formed in the case where a sufficiently large etching selectivity ratio can be ensured between the dummy gate 127 and the gate side wall DCS-SiN film 130. Specifically, in the third embodiment of the present invention, a sufficiently large etching selectivity ratio is provided between the HCD-SiN film 125 and the gate side wall DCS-SiN film 130. Therefore, it is possible to use the HCD-SiN film 125 alone as the dummy gate 127. In this case, it is possible to omit the step of forming the polysilicon film 124, the removing step with CDE, and the step of forming the oxide film 128 shown in FIG. 1D.

Figure 11H:
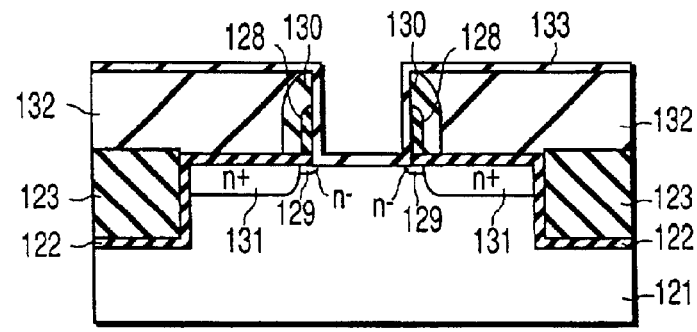

In the next step, a gate insulating film 133 is formed within the trench resulting from removal of the dummy gate 127, as shown in FIG. 11H. The gate insulating film 133 is formed of a high dielectric constant material such as $Ta_2O_5$ or $(Ba, Sr)TiO_3$.

In this embodiment, a $Ta_2O_5$ film is used as the gate insulating film 133. In forming the $Ta_2O_5$ gate insulating film 133, the substrate surface is irradiated first with oxygen radicals to form a $SiO_2$ film (not shown) in a thickness of about 0.2 to 0.3 nm, followed by forming a silicon nitride film (not shown) by using ammonia, silane, etc. Further, a $Ta_2O_5$ film is formed as the gate insulating film 133 in a thickness of about 1 nm on the silicon nitride film.

Figure 11I:
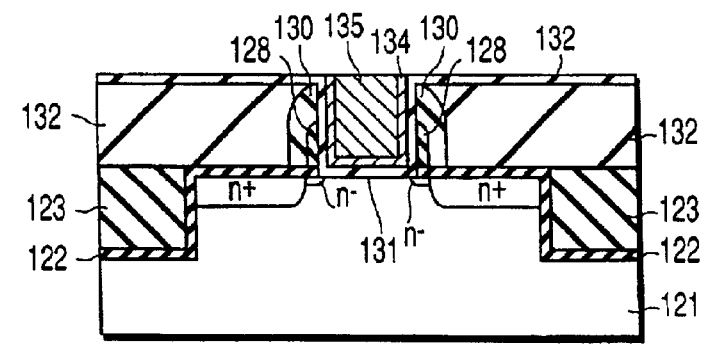

Finally, a TiN film 134 having a thickness of about 10 nm and used as a gate electrode and an Al film 135 having a thickness of about 2250 nm are formed on the entire surface to fill the trench resulting from removal of the dummy gate 127, followed by removing by CMP the excess gate insulating film 133, TiN film 134 and Al film 135 positioned outside the trench so as to flatten the surface, as shown in FIG. 11I, thereby obtaining a desired MOS transistor.

In each of the first to third embodiments, a silicon nitride film is formed for preventing short-circuiting between a lower capacitor electrode and a plug electrode in a so-called MO portion, i.e., a portion where a conductive portion connected to the silicon substrate is formed). However, it is also possible to use a silicon nitride film for other purposes.

Fourth Embodiment

FIGS. 15A to 15D are cross sectional views collectively showing a method of manufacturing a semiconductor device according to a fourth embodiment of the present invention. These drawings show a cross section of a MOS transistor included in a DRAM and the contact opening portion in a direction perpendicular to the width direction of the channel.

Figure 15A:
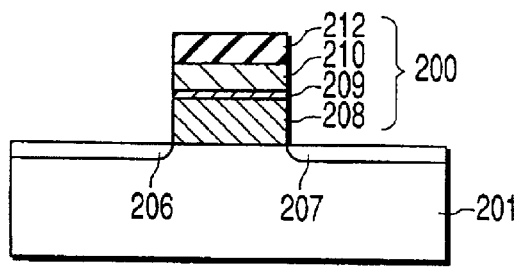
FIGS. 15A to 15D are cross sectional views collectively showing a method of manufacturing a semiconductor device according to a fourth embodiment of the present invention.

FIG. 15A shows that a gate electrode 200 prepared by selectively removing by RIE a laminate structure consisting of a polysilicon film 208 formed on a silicon substrate 201 with a gate insulating film (not shown) interposed therebetween, a WN (tungsten nitride) film 209 formed on the polysilicon film 208, a W (tungsten) film 210 formed on the WN film 209, and a SiN film 212 formed on the W film 210 is formed on the silicon substrate 201. Then, As ions are implanted under an accelerating energy of 15 keV and at a dose of $5 \times 10^{13}$ cm$^{-2}$ into surface regions of the silicon substrate 201 with the gate electrode 200 used as a mask so as to form an n$^-$-type source region 206 and an n$^-$-type drain region 207 on both sides of the gate electrode 200.

Figure 15B:
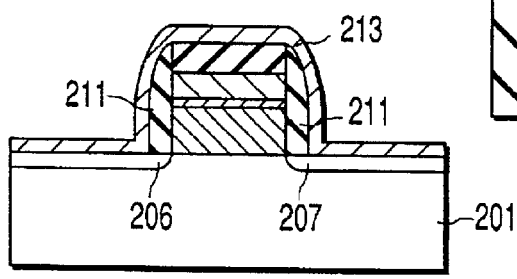

In the next step, a SiN film is formed on the entire surface of the silicon substrate 201 by an LPCVD method using DCS as a raw material, followed by etching back the SiN film to form a gate side wall insulating film 211 consisting of SiN on only the side walls of the gate electrode 200, as shown in FIG. 15B. As a result, formed is a base structure consisting of the silicon substrate 201, the gate electrode 200 and the gate side wall insulating film 211 and having a stepped structure in which the aspect ratio is about 2 and the narrowest space in the cell portion is about 0.15 μm.

Then, an HCD-SiN film 213 is formed on the entire surface of the base structure in a thickness of 15 nm by an LPCVD method using hexachlorodisilane (HCD) and ammonia (NH$_3$) as raw material gases and a nitrogen gas (N$_2$) as a carrier gas. The HCD-SiN film 213 is formed at 450° C. under a reactor inner pressure of 1.4 Torr and at a flow rate ratio of ammonia:HCD of 1000:50. The HCD-SiN film 213 thus formed acts as a RIE stopper film in the subsequent step of forming a contact hole in the interlayer insulating film, as shown in FIG. 15B.

The HCD-SiN film 213 was formed at a rate of 2.6 nm/min. Also, it was possible to form the HCD-SiN film even if a nitrogen gas was not allowed to flow during the HCD-SiN film forming process.

As shown in FIG. 6 referred to previously, the RIE selectivity ratio in the case of using HCD was substantially equal to that in the case of forming a SiN film by using the conventional DCS. Therefore, no problem is generated in the where the HCD-SiN film acting as an etching stopper is formed in a thickness of 15 nm as in the conventional case.

Figure 15C:
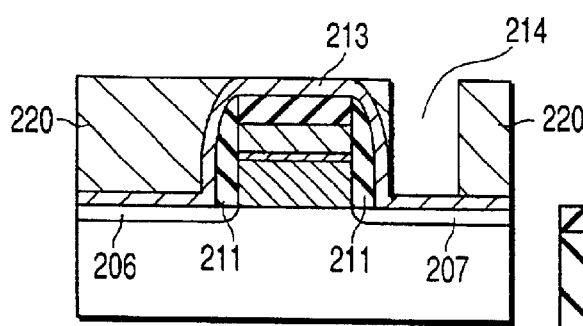

In the next step, a BPSG film is formed as an interlayer insulating film 220, followed by applying a heat treatment at 800° C. under an atmosphere containing H$_2$ and O$_2$ (2H$_2$+ O$_2$→2H$_2$O) so as to increase the density of the interlayer insulating film 220. Then, the surface of the interlayer insulating film 220 was removed in a thickness of about 370 nm by CMP using the SiN film 213 as a CMP stopper so as to flatten the surface of the interlayer insulating film 220. Further, a resist coating, light exposure and development were performed after the flattening step, followed by applying RIE to the interlayer insulating film (BPSG film) 220 so as to form a contact hole 214, as shown in FIG. 15C. It should be noted that the HCD-SiN film 213 exhibits an etching rate lower than that of the BPSG film and, thus, acts as a RIE stopper so as to stop RIE. The HCD-SiN film acting as a RIE stopper in the step of forming a contact hole in the cell portion as described above can also be used as a RIE stopper in the step of forming a contact hole in the peripheral portion.

Figure 15D:
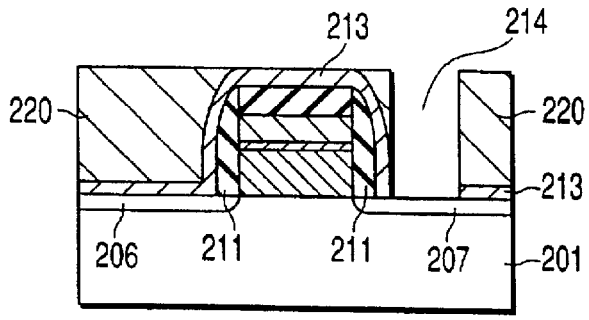

In the next step, the SiN film 213 at the bottom of the contact hole 214 is subjected to RIE by changing the gas conditions. In this case, however, it is necessary to employ a weak etching condition so as not to etch the underlying silicon substrate 201, with the result that the SiN film tends to fail to be etched completely. The residual SiN film is removed in the subsequent treatment with a dilute hydrofluoric acid for removing the native oxide film in a thickness of 1 nm, which is performed in preparation for the next step for burying a polysilicon layer acting as a contact plug, as shown in FIG. 15D.

As apparent from FIG. 13 referred to previously, the etching rate of the HCD-SiN film formed at 450° C. is not lower than 20 nm/min, which is at least twice the etching rate of the native oxide film, though the etching rate of the HCD-SiN film formed at 550° C. or more under a pressure of 0.5 Torr is low, i.e., 20 Å/min (i.e., 2 nm/min). Since the etching rate of the HCD-SiN film is at least twice the etching rate of the native oxide film as pointed out above, the SiN film remaining after the pretreatment with the dilute hydrofluoric acid can be removed completely even if the RIE is nonuniform over the entire surface in removing the SiN film in the step shown in FIG. 15D. It follows that it is possible to avoid a defective contact caused by the residual SiN film.

Incidentally, the experimental data given in FIG. 13 cover the case where a nitrogen gas was not allowed to flow during formation of the HCD-SiN film. Where a nitrogen gas is allowed to flow, the etching rate by the etching with a dilute hydrofluoric acid at, for example, 450° C. is increased to 45 nm/min so as to further facilitate the etching.

The present inventors have confirmed that, under a film-forming temperature of 450° C., an HCD-SiN film can be formed at 2 nm/min, supporting that the HCD-SiN film formation at 450° C. can be practically employed sufficiently thought the film-forming rate is somewhat lower than 3 nm/min for the DCS-SiN film formation at 780° C. It has also been confirmed that a plasma SiN film can be formed at 370° C. at a higher film-forming rate of 100 nm/min.

As described above, it is possible to form a SiN film having a low density and a low permittivity by forming the SiN film at about 450° C. by using HCD.

The low permittivity is deeply related to the low density. Specifically, the permittivity and the density are considered to meet the Clausius-Mossotti formula given on page 542 of "Solid State Physics (Saunders College Inc. (1976), by Ashcroft Mermin", i.e., $$(\epsilon - 1)/(\epsilon + 2) = \{(N_0 \times \alpha)/(3 \times \epsilon_0)\} \times (\rho/M) \quad \text{Clausius-Mossotti formula}$$

ρ represents the density, ε represents the permittivity, M represents the molecular weight, and α represents the polarizability. Also, $\epsilon_0$ and $N_0$, which are constants, represent the permittivity under vacuum and Avogadro's number, respectively. The formula indicates that the density and the permittivity are proportional to each other. In other words, it is considered reasonable to understand that the HCD-SiN of a low permittivity can be put to a practical use because it is possible to prepare an HCD-SiN film of a low density.

On the other hand, the thickness the HCD-SiN film required for allowing the HCD-SiN film to perform the function of a RIE stopper film is equal to that of the DCS-SiN film, and the HCD-SiN film has a permittivity lower than that of the DCS-SiN film. It follows that the HCD-SiN film permits ensuring the RIE barrier characteristics equal to that of the conventional DCS-SiN film and also permits markedly decreasing the capacitance between adjacent wirings.

When it comes to the transistor characteristics, it is generally known to the art that the interfacial level at the interface of the gate insulating film is decreased by the hydrogen sinter so as to increase the retention time of the transistor. This is said to be caused by the termination effect that that the defect causing the leakage current is decreased by the termination of the silicon dangling bond by hydrogen.

The hydrogen concentration within the HCD-SiN film is $1 \times 10^{22}$ cm$^{-3}$, which is higher than that in the conventional LP-SiN film, and the hydrogen gas is released at a temperature higher than the film-forming temperature so as to bring about a more prominent termination effect.

Figure 16:
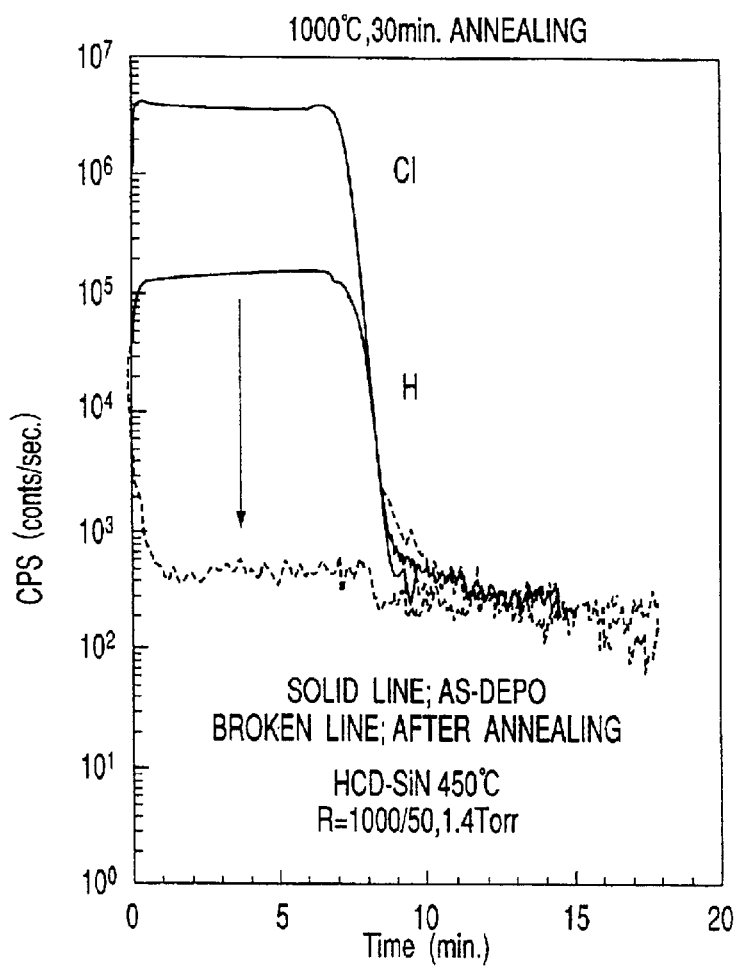
FIG. 16 shows SIMS profiles of Cl and H before and after heat treatment of an HCD-SiN film.

FIG. 16 is a graph showing the device element profile determined by SIMS in a depth direction of the HCD-SiN film both before and after the heat treatment at 1,000° C. for 30 minutes. Specifically, sputter etching was performed from the surface, and the count number per second (CPS) of each of hydrogen and chlorine atoms in the etched portion was determined by SIMS to prepare the graph of FIG. 16. The time (minutes) is plotted on the abscissa, with the count number per second (CPS) being plotted on the ordinate of the graph. The experimental data before the heat treatment are denoted by solid lines, and those after the heat treatment are denoted by dotted lines. The range between 0 minute and about 9 minutes on the abscissa of the graph represents a region corresponding to the HCD-SiN film.

As shown in the graph, the hydrogen was found to be decreased by the heat treatment from about $1.5 \times 10^5$ CPS to about $4 \times 10^2$ CPS, i.e., decreased to less than 1/100 of the value before the heat treatment. On the other hand, a significant difference was not recognized between the chlorine concentration before the heat treatment and that after the heat treatment.

Incidentally, the hydrogen concentration before the annealing corresponds to $1 \times 10^{22}$ cm$^{-3}$, and the hydrogen concentration after the annealing corresponds to a value not higher than $1 \times 10^{20}$ cm$^{-3}$ (not higher than the detectable limit). On the other hand, the chlorine concentration corresponds to $1 \times 10^{21}$ cm$^{-3}$. It has been found that, since a large amount of hydrogen is released from the HCD-SiN film by the annealing, the silicon dangling bond can be effectively terminated.

As described above, the SiN film formed by a chemical vapor deposition method using plasma (P-CVD method) or by a low pressure chemical vapor deposition method (LPCVD method) is poor in step coverage. If the SiN film is formed within a trench having an aspect ratio of about 2, the film is rendered thick in the uppermost portion of the stepped portion and thin in the lower portion and the side wall portion. Also, an overhanging portion tends to be formed in the edge at the uppermost portion.

Under the particular condition, it is difficult for the raw material gas to enter the space below the overhanging portion in the step of forming the interlayer insulating film, resulting in failure to bury the interlayer insulating film (such as BPSG film). Also, the particular SiN film noted above is not homogeneous, and the edge portion fails to perform a sufficient function of a stopper.

On the other hand, where a silicon raw material having chlorine substituted for the hydrogen of silane such as dichlorosilane (DCS) or tetrachlorosilane, a satisfactory step coverage can be obtained. Specifically, the step coverage of 100% can be obtained even if the aspect ratio is about 20. However, the compound producing the particular effect is not limited to the silane-based compound. The present inventors have found that a homogeneous film covering the stepped structure satisfactorily can be obtained by an LPCVD method using HCD that is a chloride of disilane.

In the fourth embodiment, an HCD-SiN film is used as a SiN film acting as a RIE stopper. However, the SiN film 212 formed on the gate electrode or the SiN film 211 formed on the gate side wall also produces the effect of decreasing the permittivity produced by the HCD-SiN film. In other words, since a SiN film having a low permittivity can be obtained by forming an HCD-SiN film as each of these SiN films 212 and 211, it is possible to decrease the capacitance between adjacent wirings.

Also, in the fourth embodiment, a laminate structure of polysilicon/WN/W was used as the gate electrode. Needless to say, however, a metal gate electrode made of a metal alone or a polysilicon gate electrode can be used in place of the laminate structure noted above.

Fifth Embodiment

Figure 17A:
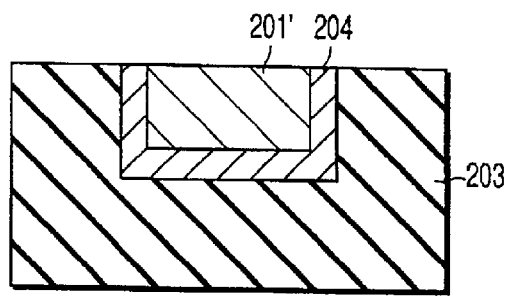
FIGS. 17A and 17B are cross sectional views collectively showing a method of manufacturing a semiconductor device according to a fifth embodiment of the present invention.
Figure 17B:
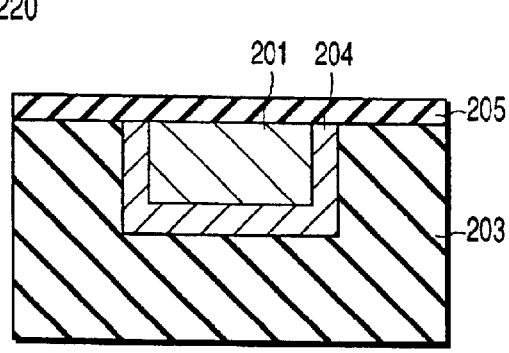

FIGS. 17a and 17B are cross sectional views collectively showing a method of manufacturing a semiconductor device according to a fifth embodiment of the present invention. These drawings show cross sections in a direction perpendicular to the Cu wiring included in the semiconductor device.

Specifically, FIG. 17A shows that a tantalum nitride (TaN) film 204 as a barrier metal film and a metal wiring 201' as a Cu wiring are buried in a wiring trench formed in a TEOS interlayer insulating film 203. Then, the surface is flattened by CMP so as to provide a base structure (wiring layer). After the flattening step, a SiN film 205 is formed in a thickness of 10 nm at 450° C. on the entire surface by an LPCVD method using HCD and NH$_3$ as raw material gases. During the film formation, the inner pressure of the reactor is set at 1.4 Torr and the flow rate ratio of ammonia:HCD:nitrogen is set at 1000:50:50.

Figure 18:
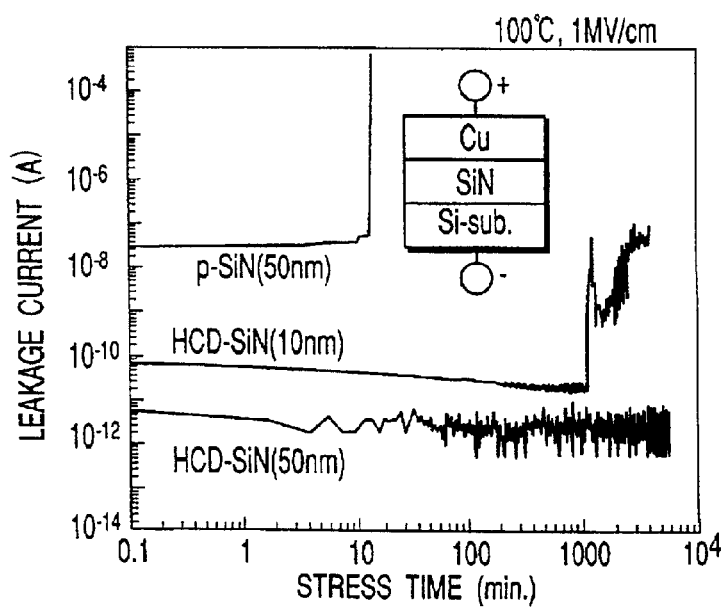
FIG. 18 shows the changes with time in the leakage current through various SiN films.

The following experiment was conducted for measuring the breakdown voltage of the SiN film 205. For preparing a sample used for the experiment, a SiN film was formed in a predetermined thickness on a silicon substrate, followed by forming a Cu film on the SiN film. Then, a predetermined voltage was applied between the silicon substrate and the Cu film so as to measure the change with time in the leakage current. FIG. 18 shows the results.

FIG. 18 is a graph showing the results of a so-called "BT test" (bias-temperature stress test), in which the application time (stress time, minutes) is plotted on the abscissa, and the leakage current is plotted on the ordinate. Specifically, FIG. 18 shows the change with time in the leakage current, covering the case where any of a P-SiN film having a thickness of 50 nm, an HCD-SiN film having a thickness of 10 nm and an HCD-SiN film having a thickness of 50 nm is formed on a silicon substrate, followed by forming a Cu film on the SiN film, and a voltage of 1 MV/cm was applied between the silicon substrate and the Cu film at 100° C. so as to measure the change with time in the leakage current (amperes).

In general, the Cu diffusion is said to be caused by Cu$^{1+}$ ions, and the bias is applied under the condition that the Cu electrode bears a higher potential so as to permit the Cu$^{1+}$ ions to be diffused into the silicon substrate. In the graph of FIG. 18, the leakage current is plotted on the ordinate, and the stress time is plotted on the abscissa. A film that is not broken over a longer time (leakage current being stable) is said to have a higher barrier property. As apparent from the graph, the HCD-SiN film having a thickness of any of 50 nm and 10 nm is superior to the plasma SiN film in the barrier property to the Cu diffusion.

The term "breakdown" implies the point where the leakage current is rapidly changed. FIG. 18 shows that the breakdown occurs in about 13 minutes in the P-SiN film having a thickness of 50 nm, in about 1,000 minutes in the HCD-SiN film having a thickness of 10 nm, and in 5,000 minutes or more in the HCD-SiN film having a thickness of 50 nm.

The HCD-SiN film is superior to the plasma-SiN film in the barrier property in spite of the fact that the HCD-SiN film is thinner than the plasma-SiN film. The reason for the particular phenomenon is considered to reside in that the HCD-SiN film has a higher chlorine concentration.

Figure 19:
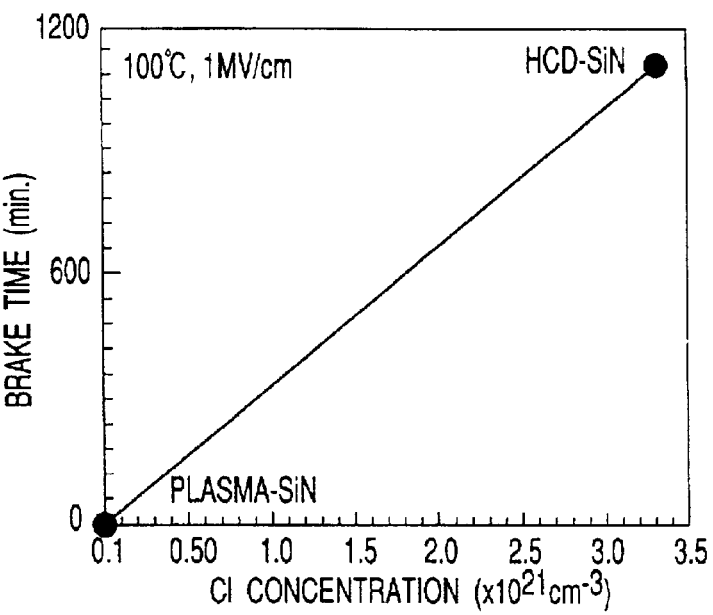
FIG. 19 is a graph showing the relationship between the time required for breakage of a SiN film and the Cl concentration in the SiN film.

FIG. 19 is a graph showing the relationship between the break time, which is plotted on the ordinate, and the chlorine concentration, which is plotted on the abscissa. As apparent from the graph, the break time is increased with increase in the Cl concentration. In other words, Cl is not contained at all in the P-SiN film because a Cl-containing raw material is not used for forming the P-SiN film, leading to a very short break time. On the other hand, the HCD-SiN film has a very high Cl concentration of $3.4 \times 10^{21}$ cm$^{-3}$, leading to a break time exceeding 1,000 minutes.

It should be noted that Cl has a large electronegativity and, thus, is charged negative. As a result, the Cu$^{1+}$ diffusion species are considered to be trapped by the Cl sites, leading to a long break time. Also, the HCD-SiN film formed at a low temperature is known to have a small permittivity of 5.4, as shown in FIG. 3. In other words, if an HCD-SiN film is used, it is possible to obtain a high insulation breakdown voltage even in the case of using a thinner film having a small permittivity. The reduction in the capacitance between adjacent wirings achieved by the use of the HCD-SiN film is about 20%, compared with the use of the conventional DCS-SiN film.

The fourth and fifth embodiments of the present invention are not limited to the semiconductor device and the method of manufacturing the semiconductor device described above. In other words, these embodiments can be applied widely to an insulating film requiring a low permittivity and to an insulating film requiring a high breakdown voltage.

In each of the fourth embodiment and fifth embodiment of the present invention described above, hexachlorodisilane (HCD) is used as the raw material of the silicon nitride film. However, the raw material of the silicon nitride film is not limited to HCD. Specifically, it is possible to use as the raw material any kind of silicon chloride represented by a general formula $Si_nCl_{2n+2}$, where n is an integer not smaller than 2, or $Si_nCl_{2n+2-x}H_x$, where x is an integer not smaller than 0 and not larger than 2n+1. By using a gaseous material having a large number of Cl radicals, it is possible to form a silicon nitride film having a high chlorine concentration.

Sixth Embodiment

Figure 20A:
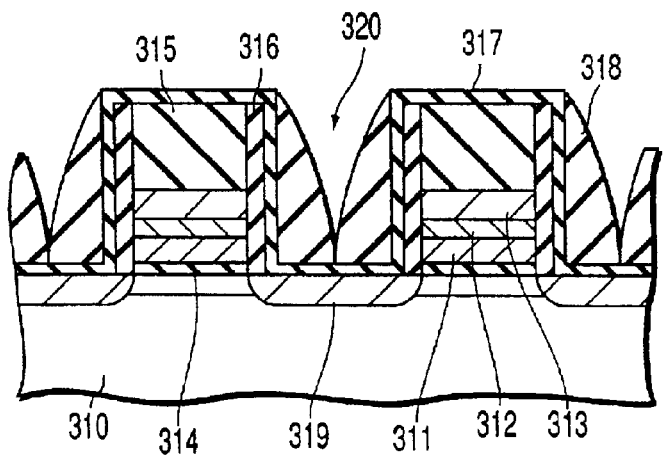
FIGS. 20A and 20B are cross sectional views collectively showing a method of manufacturing a semiconductor device according to a sixth embodiment of the present invention.
Figure 20B:
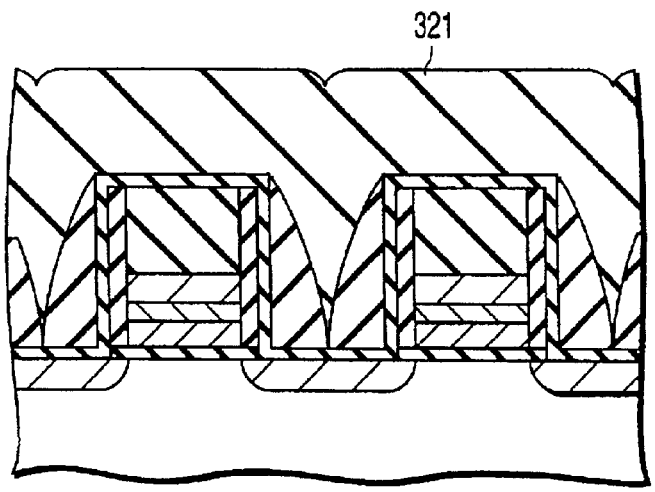

FIGS. 20A and 20B are cross sectional views showing a method of burying a silicon oxide film in a concave portion between adjacent gate electrodes (or gate wirings) by a method according to a sixth embodiment of the present invention.

Specifically, FIG. 20A shows the construction of the gate electrode formed on a silicon substrate 310 by an ordinary method and the peripheral structure. As shown in the drawing, the gate electrode is formed of a laminate structure comprising a polysilicon film 311, a WN film 312 and a W film 313. A gate insulating film 314 is formed below the gate electrode. Also, a cap silicon nitride film 315 is formed on the upper surface of the gate electrode, and a side wall silicon nitride film 316 is formed on the side wall of the gate electrode. A liner silicon nitride film 317 is formed around the gate electrode of the particular construction, and a BPSG film 318 is formed on the side surfaces of the liner silicon nitride film 317. Further, a diffusion layer 319 forming the source/drain region is formed between the adjacent gate electrodes.

Then, a silicon oxide film 321 is formed on the substrate having a concave portion 320 formed between the adjacent gate electrodes, as shown in FIG. 20B.

Specifically, after formation of the structure shown in FIG. 20A, a silicon nitride film is formed by an LPCVD method using HCD and ammonia as raw material gases. It is possible to use a nitrogen gas or a rare gas as a diluting gas. The silicon nitride film is formed at a temperature of 250° C., an NH$_3$/HCD flow rate ratio of 1000/10, and a reactor inner pressure of 1.4 Torr. As a result, formed on the entire surface is a silicon nitride film containing chlorine (SiN:HCl composition). The film-forming rate under the conditions given above was found to be 0.26 nm/min.

Figure 21:
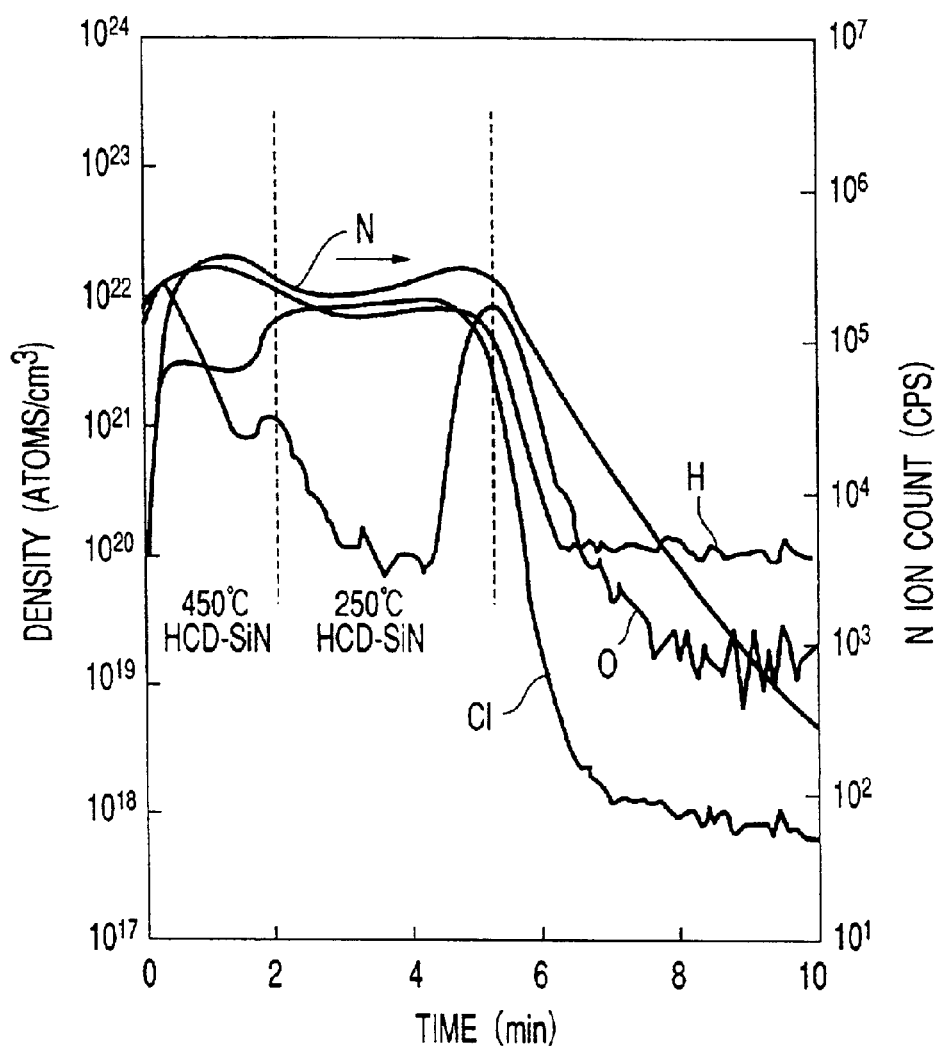
FIG. 21 show SIMS profiles of various device elements contained in the silicon nitride film of the present invention.

FIG. 21 is a graph showing the SIMS profile of each device element contained in the silicon nitride film thus formed. The concentrations of oxygen (O), hydrogen (H) and chlorine (Cl) are given in the graph of FIG. 21. Also, an ion count numbers (CPS) of nitrogen (N) is shown in FIG. 21. In this experiment, a silicon nitride film was formed at 450° C. on the upper surface of an HCD-SiN film formed at 250° C. in order to prevent the HCD-SiN film from being oxidized. FIG. 21 shows that the HCD-SiN film formed at 250° C. contains about $1 \times 10^{22}$ cm$^{-3}$ of chlorine.

In the next step, the formed silicon nitride film is oxidized under mild conditions so as to convert the silicon nitride film into a silicon oxide film 321 containing chlorine, as shown in FIG. 20B. The oxidizing treatment was performed for 10 minutes under, for example, an oxygen gas atmosphere under an oxidizing temperature of 600° C. By this oxidizing treatment, the film thickness is increased by about 20%, e.g., the film thickness is increased from 22.9 nm to 27.8 nm. Also, the refractive index is decreased from 1.56 to 1.43 to exhibit a value substantially equal to that of the ordinary silicon oxide film. In short, by the oxidizing treatment under mild conditions, the volume of the silicon nitride film is increased, and the silicon nitride film is converted into the silicon oxide film 321. Incidentally, the silicon nitride film formed under the conditions given above is converted into a silicon oxide film, if the nitride film is allowed to stand under the air atmosphere of room temperature for a long time.

FIG. 22 is a graph showing the SIMS profile of each device element contained in the silicon oxide film converted from the silicon nitride film. The concentrations of oxygen (O), hydrogen (H) and chlorine (Cl) are given in the graph of FIG. 22. Also, an ion count number (CPS) of nitrogen (N) is shown in FIG. 22. The silicon oxide film contains about $6 \times 10^{19}$ cm$^{-3}$ of chlorine and about $1 \times 10^{21}$ cm$^{-3}$ of hydrogen. The measurement was performed by using Cs$^+$ as the primary ion species under a primary accelerating energy of 5 keV and a sputter rate of 0.4 nm/sec. Also, the ion count of NSi43 (ion of segment consisting of nitrogen having an atomic weight of 14 and Si having an atomic weight of 29) was found to be $6 \times 10^2$ (CPS). Incidentally, the ion count of the silicon nitride film formed at 650° C. by using HCD and containing $4 \times 10^{22}$ cm$^{-3}$ of nitrogen was found to be $5 \times 10^5$ CPS under the measuring conditions given above.

In the sixth embodiment, a silicon nitride film containing chlorine is formed by an LPCVD using HCD as a raw material, followed by oxidizing the silicon nitride film into a silicon oxide film, thereby burying the silicon oxide film uniformly and homogeneously in a concave portion or a stepped portion. Also, even if a void is present in the silicon nitride film, it is possible to obtain a silicon oxide film that does not include the void because the volume is increased when the silicon nitride film is converted into the silicon oxide film.

In the example described above, the silicon nitride film was formed at 250° C. However, similar effects can be obtained by suitably selecting the oxidizing conditions, if the film-forming temperature is lower than 450° C. Also, in the example described above, an oxygen gas ($O_2$) was used as the oxidizing atmosphere. However, it is also possible to employ an ozone ($O_3$) atmosphere. In the case of employing an ozone atmosphere, the silicon nitride film can be converted into the silicon oxide film at a lower temperature. Further, the silicon nitride film can be converted into the silicon oxide film by an oxidizing treatment under a steam or by the oxidizing treatment using chemicals acting as an oxidizing agent such as an ozone solution or a hydrogen peroxide solution.

Seventh Embodiment

Figure 23A:
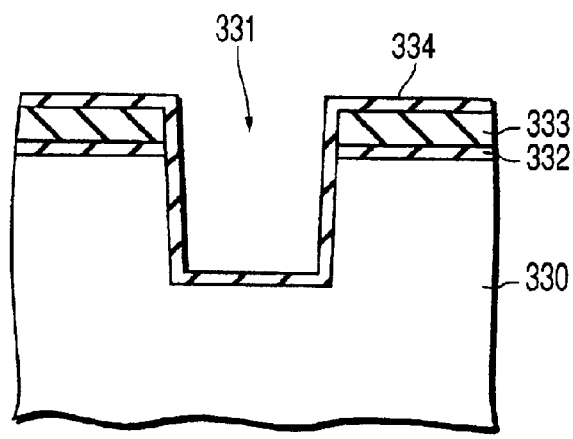
FIGS. 23A to 23C are cross sectional views collectively showing a method of manufacturing a semiconductor device according to a seventh embodiment of the present invention.
Figure 23B:
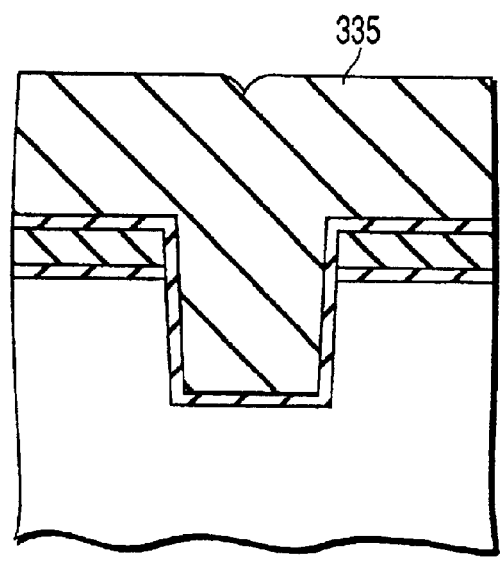
Figure 23C:
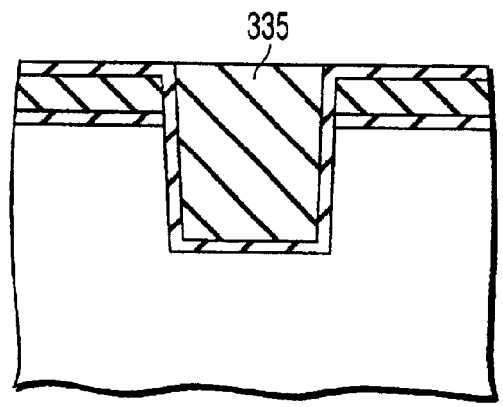

FIGS. 23A to 23C are cross sectional views showing a step of burying a silicon oxide film in a device element isolating trench in an STI structure according to a seventh embodiment of the present invention.

Specifically, FIG. 23A shows the structure at the time when a device element isolating trench 331 is formed on a silicon substrate 330 by an ordinary method. As shown in the drawing, a silicon oxide film 332 is formed on the surface except the trench portion 331, and a silicon nitride film 333 is formed on the silicon oxide film 332. Further, a thin silicon oxide film 334 is formed on the entire surface.

FIG. 23B shows that a silicon oxide film 335 containing chlorine is formed on the substrate having the device element separating trench 331 formed thereon. The silicon oxide film 335 is obtained by forming first a silicon nitride film by an LPCVD method using HCD as a raw material gas, followed by oxidizing the silicon nitride film to convert the silicon nitride film into the silicon oxide film 335, as in the sixth embodiment.

Finally, that portion of the silicon oxide film 335 which is positioned outside the device element separating trench 331 is removed by CMP as shown in FIG. 23C so as to finish the device element separating step by STI.

In the seventh embodiment, a silicon oxide film that does not include a void can be buried uniformly and homogeneously within the device element separating trench as in the sixth embodiment.

Eighth Embodiment

FIGS. 24A to 24F are cross sectional views collectively showing a method of burying a silicon oxide film in a concave portion of a base structure according to an eighth embodiment of the present invention. The base structure used in this embodiment includes the structure of the sixth embodiment shown in FIG. 20A or the structure of the seventh embodiment shown in FIG. 21A.

In each of the sixth and seventh embodiments, a silicon nitride film containing chlorine is formed to fill an entire region of a concave portion by an LPCVD method using HCD as a raw material gas, followed by converting the silicon nitride film into a silicon oxide film. In the eighth embodiment, however, the step of forming a silicon nitride film and the step of converting the silicon nitride film into a silicon oxide film are repeated a plurality of times so as to fill finally the entire region of the concave portion with the silicon oxide film.

Figure 24A:
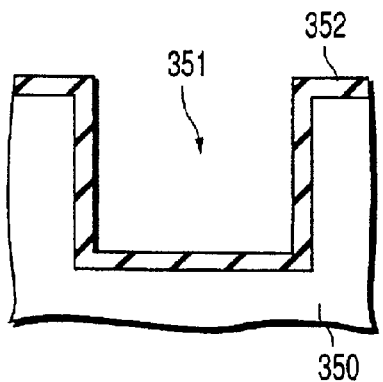
FIGS. 24A to 24F are cross sectional views collectively showing a method of manufacturing a semiconductor device according to an eighth embodiment of the present invention.

In the first step, a silicon nitride film 352 containing chlorine is formed within a concave portion 351 formed in an underlying layer 350, as shown in FIG. 24A. The silicon nitride film 352 is formed under the conditions equal to those in the sixth embodiment.

Then, the silicon nitride film 352 is oxidized so as to be converted into a silicon oxide film 353 containing chlorine. The converting conditions are also equal to those in the sixth embodiment.

Figure 24D:
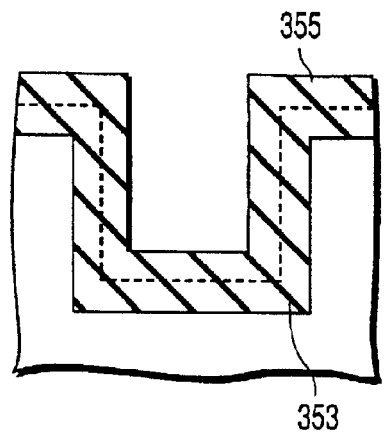
Figure 24B:
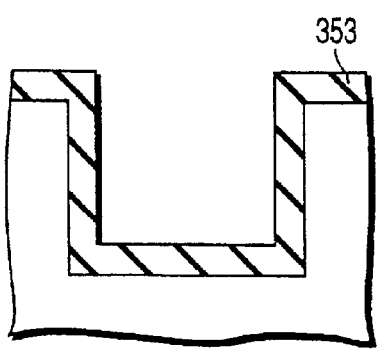
Figure 24E:
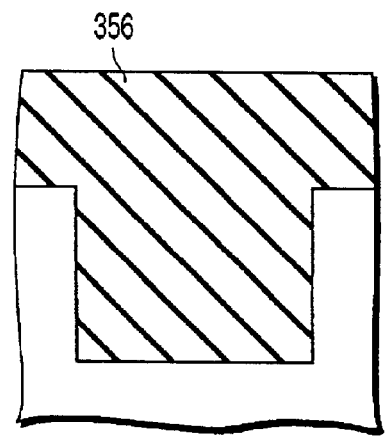
Figure 24C:
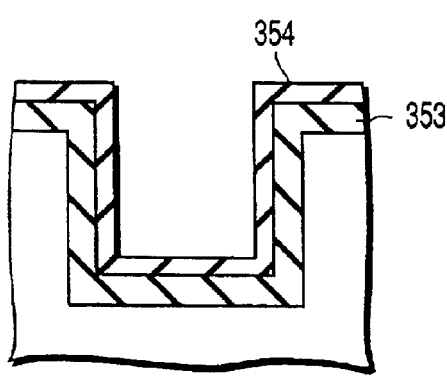
Figure 24F:
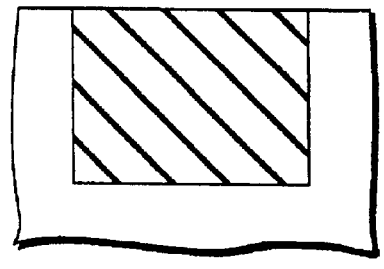

After formation of the silicon nitride film 354 containing chlorine, the silicon nitride film 354 is oxidized as in FIGS. 24A and 24B so as to be converted into the silicon oxide film 355, as shown in FIGS. 24C and 24D. The step of forming the silicon nitride film and the step of converting the silicon nitride film into the silicon oxide film are repeated a plurality of times so as to form finally a silicon oxide film 356 containing chlorine in a manner to fill completely the entire region within the concave portion, as shown in FIG. 24E.

According to the eighth embodiment, the step of forming a silicon nitride film and the step of converting the silicon nitride film into a silicon oxide film are repeated a plurality of times, making it possible to decrease the thickness of each silicon nitride film. It follows that, even where the concave portion is deep and, thus, it is difficult to convert the silicon nitride film into the silicon oxide film by a single oxidizing treatment, the silicon oxide film can be formed easily within the entire region of the concave portion.

In each of the sixth to eighth embodiments described above, a silicon nitride film containing chlorine is formed by an LPCVD method. However, it is also possible to allow the silicon nitride film to further contain at least one of phosphorus (P) and boron (B). For allowing the silicon nitride film to contain phosphorus, $PH_3$ is used together with HCD and ammonia used as the raw material gases. Also, for allowing the silicon nitride film to contain boron, $B_2H_6$ is used together with HCD and ammonia used as the raw material gases.

By applying an oxidizing treatment to a silicon nitride film containing at least one of phosphorus and boron as in the sixth embodiment, a silicon oxide film containing at least one of phosphorus and boron together with chlorine, e.g., a BPSG film containing chlorine, can be formed within a concave portion. Incidentally, it is desirable for the silicon oxide film to contain 3 to 10% by weight of each of phosphorus and boron.

If the silicon oxide film is allowed to contain phosphorus and boron, it is possible to obtain a gettering effect of impurities such as Na and Fe that bring about deterioration of electrical characteristics, not to mention the effects described previously in conjunction with the sixth to eighth embodiments. Also, where employed in the structure shown FIGS. 20A and 20B, the underlying silicon nitride film can be etched at a high selectively in forming a contact hole by RIE in the silicon oxide film 321 (silicon oxide film containing phosphorus or boron in addition to chlorine in this case), making it possible to form the contact hole easily.

Ninth Embodiment

The background of the motivation of the present invention will now be described. Various technical problems must be solved for realizing a semiconductor device of the next era by further enhancing the degree of integration and miniaturization.

For example, the problems of a silicon nitride film, which is applied to various points, will now be described. Specifically, a silicon nitride film is used in various portions of a semiconductor integrated circuit including, for example, an electrical insulating film, a capacitor or a gate insulating film, an etching stopper, a barrier film, and a passivation film.

The problems that must be solved in applying a silicon nitride film to a semiconductor device can be roughly classified into the three problems pointed out below:

1. In a semiconductor device of the next era having a higher degree of integration and an advanced miniaturization, a silicon nitride film must be formed to cover sufficiently an underlying film having a fine irregularity. In general, an LPCVD method is employed for forming a silicon nitride film having a good step coverage. In the case of employing an LPCVD method, a silicon nitride film is formed in general at about 800° C. However, the film-forming temperature of about 800° C. is unduly high because a metal wiring, a barrier metal film, a silicide film and a shallow diffusion layer included in the semiconductor device of the next era are low in resistance to heat.

2. The silicon nitride film used as an etching stopper film or as a hard mask is low in its resistance to etching. In order to ensure a required resistance to etching, it is necessary to increase the thickness of the silicon nitride film. If the film thickness is increased, a long time is required for forming a silicon nitride film, leading to a large thermal budget. Under a large thermal budget, various problems such as elongation (re-diffusion) and inactivation of the diffusion layer, agglomeration and corrosion of a metal film and agglomeration of a silicide layer are generated in the portion where the resistance to heat is low so as to deteriorate the device characteristics. Also, the productivity is low so as to increase the manufacturing cost.

3. A silicon nitride film has a high permittivity 7.5. If an insulating film having a high permittivity is used in a plurality of portions, the parasitic capacitance between adjacent wirings or between adjacent wiring layers is increased. If miniaturization of the integrated circuit is further promoted in future, the distances between adjacent gate electrodes and between adjacent wirings are further decreased. Therefore, if an insulating film having a permittivity of the present level is used, the parasitic capacitance is further increased. What should also be noted is that, if the parasitic capacitance is increased, the effective capacitance of, for example, the capacitor holding the stored information is decreased by an amount corresponding to the parasitic capacitance. In order to make up for the decreased capacitance, it is necessary to increase the capacitance and area of the capacitor. This brings about an enlargement of the chip size and an increased manufacturing cost.

FIGS. 25A to 25D are cross sectional views in a direction perpendicular to the longitudinal direction of the channel of a MOS transistor included in a DRAM cell. These drawings collectively show a method of manufacturing a semiconductor device according to the ninth embodiment of the present invention.

Figure 25A:
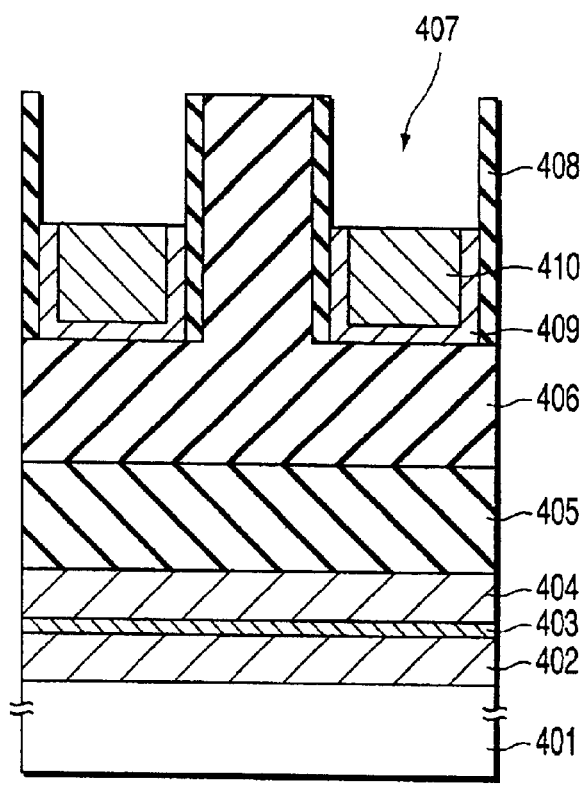
FIGS. 25A to 25D are cross sectional views collectively showing a method of manufacturing a semiconductor device according to a ninth embodiment of the present invention.

In the first step, the structure shown in FIG. 25A is prepared by the known method. The structure shown in FIG. 25A comprises a plurality of MOS transistors constituting a memory cell, gate electrodes, and a metal wiring formed on the gate electrodes and buried in a trench so as to constitute a bit line or a word line.

To be more specific, the structure shown in FIG. 25A comprises a silicon substrate 401, a polysilicon film (gate) 402, a tungsten nitride film (gate) 403, a tungsten film (gate) 404, a silicon nitride film 405, a silicon oxide film (interlayer insulating film) 406, a trench 407, a silicon nitride film 408, a barrier metal film, e.g., Ti film/TiN film, 409, and a metal wiring, e.g., W wiring, 410.

A maximum aspect ratio of that portion of the trench 407 in which the metal wiring 410 is not buried is about 1 (depth of about 150 nm and a width of about 150 nm). The trench 407 is formed by successively depositing the barrier metal film 409, the metal wiring 410, a metal film, e.g., a TiN film, and another metal film, e.g., a W film, followed by etching back these metal films.

Figure 25B:
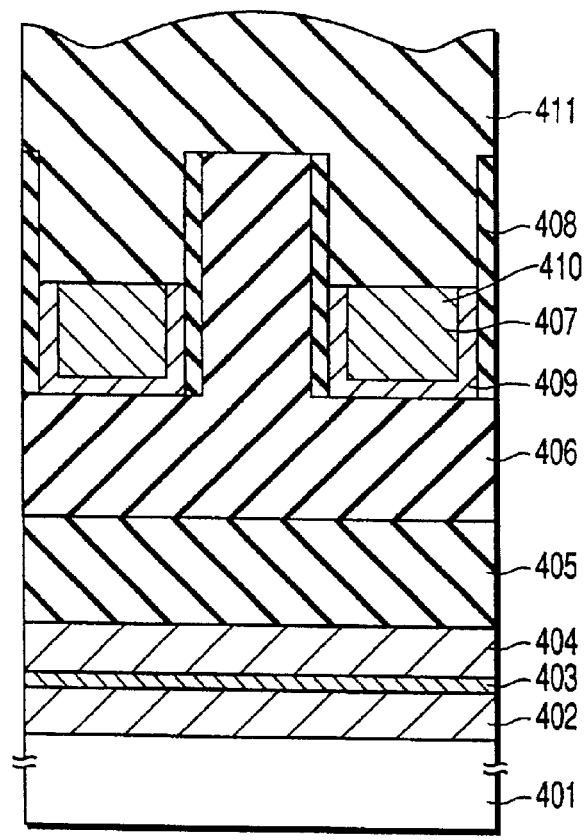

Then, a silicon nitride film 411 acting as a cap insulating film is formed in a thickness of 200 nm by an LPCVD method excellent in controllability and covering properties, as shown in FIG. 25B. The silicon nitride film 411 is required to be homogeneous and uniform. In addition, the silicon nitride film 411 must be formed not to leave a clearance in the trench 407. Therefore, a film-forming method exhibiting good covering properties such as an LPCVD method is employed for forming the silicon-nitride film 411.

It should also be noted that the barrier metal film 409 is not resistant to heat. Therefore, in the method of forming a silicon nitride film using dichlorosilane (DCS) as a raw material, i.e., in the conventional film-forming method requiring a high temperature and a long film-forming time, e.g., 700° C. for 330 minutes, the titanium silicide layer in the contact portion is agglomerated or the impurities in the diffusion layer are inactivated.

Such being the situation, the silicon nitride film 411 is formed in the ninth embodiment of the present invention by an LPCVD method using a silicon source capable of forming a film at a low temperature not higher than 700° C. such as HCD and ammonia, at a film-forming temperature of 600° C., under a reactor inner pressure of 0.5 Torr and an ammonia/HCD/methyl amine flow rate ratio of 2000/20/20. For this purpose, it is desirable to set a film-forming temperature of the silicon nitride film at a temperature not higher than 700° C.

In the ninth embodiment of the present invention, the silicon nitride film 411 is formed at a rate of 1.3 nm/min, and contains hydrogen, chlorine and carbon as impurities. The hydrogen concentration is $5 \times 10^{21}$ cm$^{-3}$, the chlorine concentration is $9 \times 10^{20}$ cm$^{-3}$, and the carbon concentration is $5 \times 10^{21}$ cm$^{-3}$. In order to obtain a sufficient effect of the present invention, it is desirable for each of the chlorine concentration and the carbon concentration to be at least $4 \times 10^{20}$ cm$^{-3}$.

In the ninth embodiment, methyl amine is used as a carbon source. Alternatively, it is also possible to use as a carbon source a hydrocarbon compound or an amine compound such as methane, ethane, ethylene, acetylene and dimethyl amine.

Figure 25C:
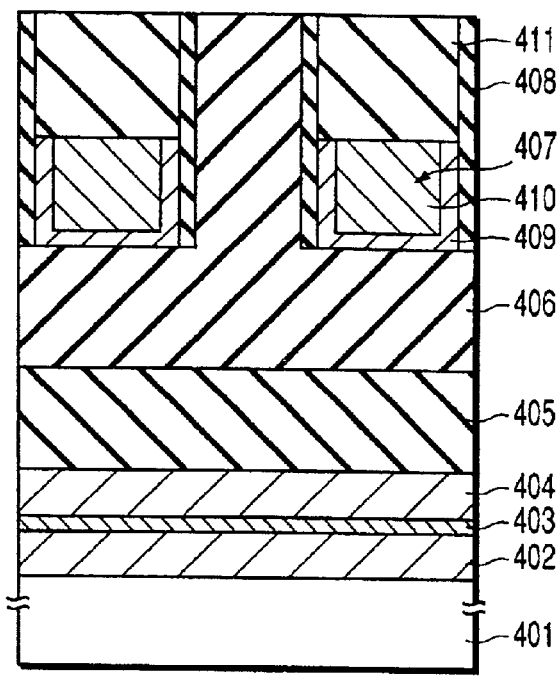

In the next step, that portion of the silicon nitride film which is positioned outside the trench 407 is removed by CMP so as to flatten the surface, as shown in FIG. 25C. In the flattening step, the silicon oxide film 406 is used as the CMP stopper. The CMP is performed under the general condition for polishing a silicon nitride film. For example, the CMP is performed by using a slurry containing small silica particles and 2.5% by weight of phosphoric acid under a polishing pad load of 200 gf.

The polishing rate in the CMP treatment is not affected by the lowered film-forming temperature and by the change in the silicon source. Under the polishing conditions given above, the polishing rate of the silicon nitride film formed by the conventional method or by the method of the ninth embodiment of the present invention was found to be 20 nm/min. In other words, even if a silicon nitride film acting as a cap insulating film is formed by the method of the present invention, it has been found possible to obtain the polishing characteristics for flattening the surface equal to those of the conventional method.

As described above, a silicon nitride film can be formed at a low temperature in the ninth embodiment of the present invention, making it possible to eliminate the problem that the device characteristics are deteriorated in the step of forming a cap insulating film (i.e., the step of forming the silicon nitride film 411).

It has also been found that the method according to the ninth embodiment of the present invention permits lowering the density of the silicon nitride film so as to diminish the permittivity of the silicon nitride film.

Figure 26:
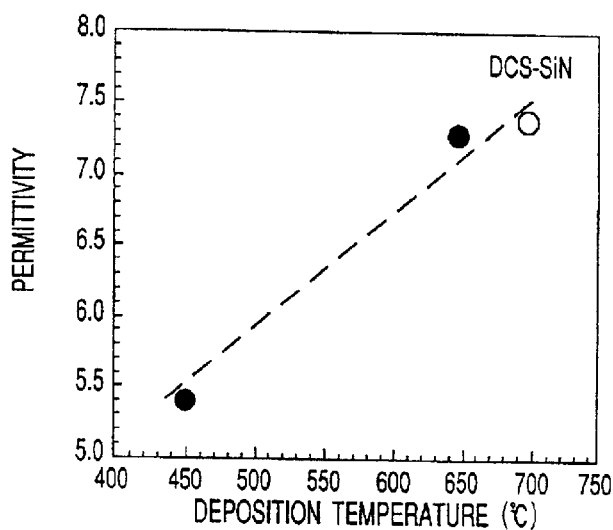
FIG. 26 is a graph showing the relationship between the permittivity of a silicon nitride film in which carbon is not introduced and the film-forming temperature.

FIG. 26 is a graph showing the relationship between the permittivity and the deposition temperature in respect of a silicon nitride film to which methyl amine is not added, i.e., a silicon nitride film not having carbon introduced therein. Incidentally, the permittivity of the silicon nitride film having carbon introduced therein was found to be 6.4 at a film-forming temperature (deposition temperature) of 600° C. The white circle and black circles shown in the graph represent permittivity of DCS-SiN and HCD-SiN, respectively.

Figure 25D:
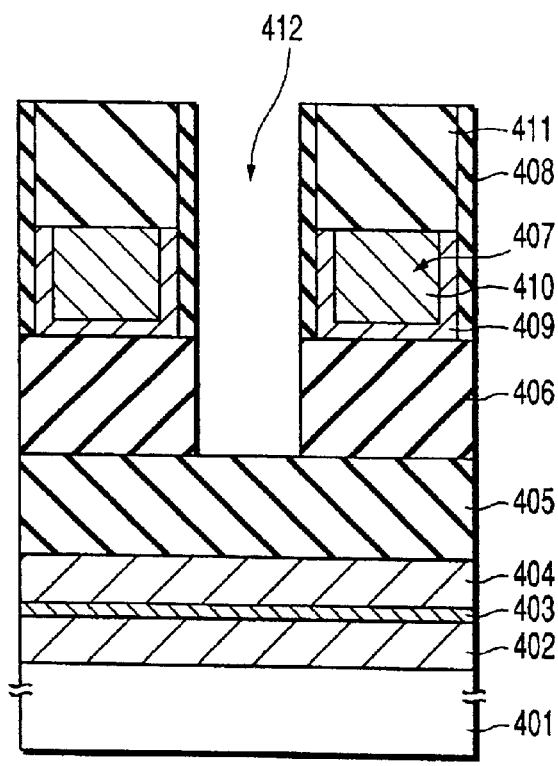

In the next step, a resist pattern (not shown) is formed, and the silicon oxide film 406 is removed by RIE using the silicon nitride film 411 and the resist pattern as a mask so as to form a contact hole 412 by self-alignment, as shown in FIG. 25D.

The RIE etching rate of the silicon nitride film 411 is substantially irrelevant to the film-forming temperature.

Figure 27:
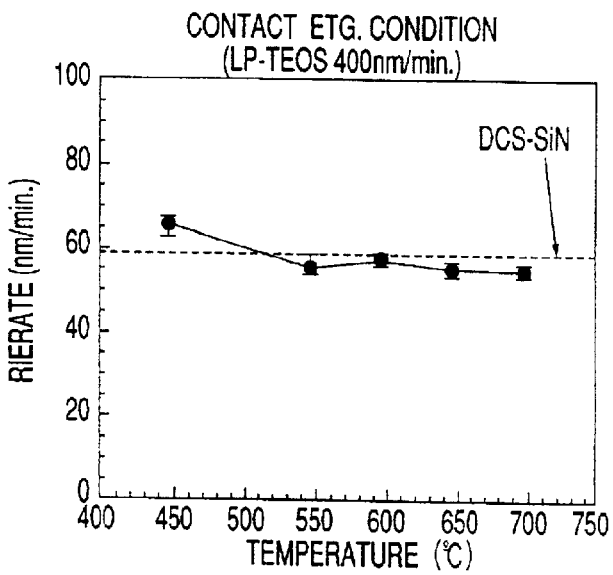
FIG. 27 is a graph showing the relationship between the RIE rate of a silicon nitride film in which carbon is not introduced and the film-forming temperature.

FIG. 27 is a graph showing the relationship between the RIE rate of a silicon nitride film that does not contain carbon and the film-forming temperature. As apparent from the graph, the RIE rate of the particular silicon nitride film is equal to that of a DCS-SiN film formed at 700° C. (conventional silicon nitride film) until the film-forming temperature is lowered to 550° C., though the RIE rate of the particular silicon nitride film is somewhat increased if the film-forming temperature is further lowered to 450° C.

Figure 28:
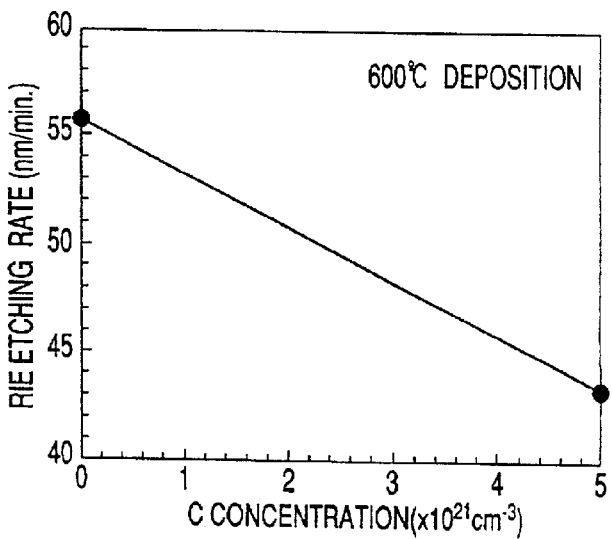
FIG. 28 is a graph showing the relationship between the RIE rate and the carbon concentration in a silicon nitride film.

FIG. 28 is a graph showing the relationship between the RIE rate and the carbon concentration in a silicon nitride film. As apparent from the graph, the RIE rate can be lowered by about 20% by introducing carbon into a silicon nitride film, compared with a silicon nitride film not having carbon introduced therein.

In the RIE step shown in FIG. 25C, corners of the exposed portion of the silicon nitride film 411, which is not covered with the resist pattern and functions as a mask, are removed by the etching species such as ions and radicals of RIE so as to make roundish the exposed portion of the silicon nitride film 411.

Figure 29:
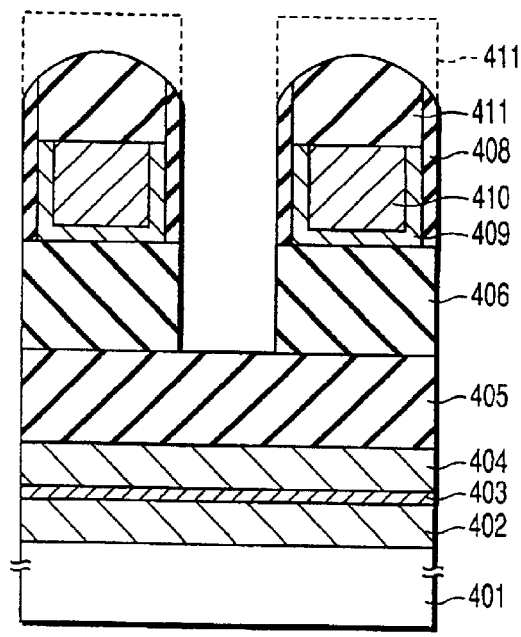
FIG. 29 shows how the entire silicon nitride film is rounded in the RIE step.

FIG. 29 shows the silicon nitride film 411 having an upper portion made roundish in the RIE step. The dotted lines in the drawing denote the silicon nitride film 411 after completion of the CMP treatment and before the RIE step.

It is necessary for the silicon nitride film acting as a cap insulating film to perform the function of electrically insulating an electrode formed exactly sideward of the silicon nitride film from the lower electrode of a capacitor formed above the silicon nitride film. Therefore, it is necessary for the silicon nitride film acting as a cap insulating film to have a reasonable thickness after completion of the RIE step.

It has been found that the polished amount of the conventional silicon nitride film not having carbon introduced therein is 18 nm in an upper portion and 70 nm in the corner portion. On the other hand, the polished amount has been found to be 14 nm in an upper portion and 54 nm in the corner portion in the silicon nitride film of the present invention having carbon introduced therein.

In other words, in the case of using the conventional silicon nitride film, it is necessary for the silicon nitride film before the RIE step to have a thickness of 200 nm in order to ensure a thickness after the RIE step large enough to use the nitride film as a cap insulating film. In the case of using the silicon nitride film of the present invention, however, it is possible to decrease the thickness before the RIE step to 160 nm.

As described above, the ninth embodiment of the present invention makes it possible to form a silicon nitride film having a permittivity lower than that of the conventional silicon nitride film and exhibiting a resistance to etching. It follows that a thin silicon nitride film having a permittivity lower than that of the conventional silicon nitride film can be used so as to decrease the parasitic capacitance of the interlayer insulating film included in a semiconductor device.

How to decrease the parasitic capacitance of an IG-DRAM, which is a DRAM of the next era, will now be described specifically.

Figure 30A:
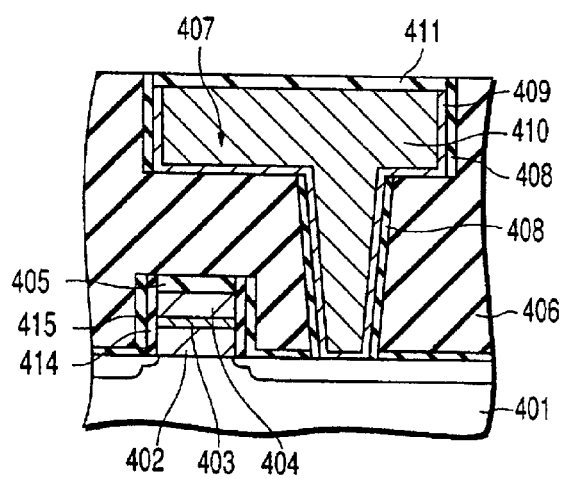
FIG. 30A is a cross sectional view showing a DRAM using a silicon nitride film of the present invention.

FIG. 30A is a cross sectional view of a DRAM using a silicon nitride film of the present invention. On the other hand, FIG. 30B is a cross sectional view of a DRAM using a conventional silicon nitride film.

In an actual semiconductor device, a plurality of wirings cross each other in a complex fashion. Likewise, the electrode and the wiring cross each other in a complex fashion. As a result, the generated electric fields are distributed in a complex fashion. Such being the situation, only an electrode arrangement contributing to the parasitic capacitance is shown in the drawings. Also, those portions corresponding to the portions shown in FIGS. 25A to 25D are denoted by the reference numerals used in FIGS. 25A to 25D. The structure shown in FIGS. 30A and 30B includes a source/drain diffusion layer 413 of an LDD structure, an insulating film 414 on an upper portion of the gate, and gate side wall insulating films 415 and 416.

The parasitic capacitance is generated between, for example, the gate electrodes 402–404 and the metal wiring 410. In the present invention, the thin silicon nitride film 411 having a permittivity lower than that of the conventional silicon nitride film is formed between the gate electrode and the metal wiring, making it possible to sufficiently decrease the parasitic capacitance.

Figure 30B:
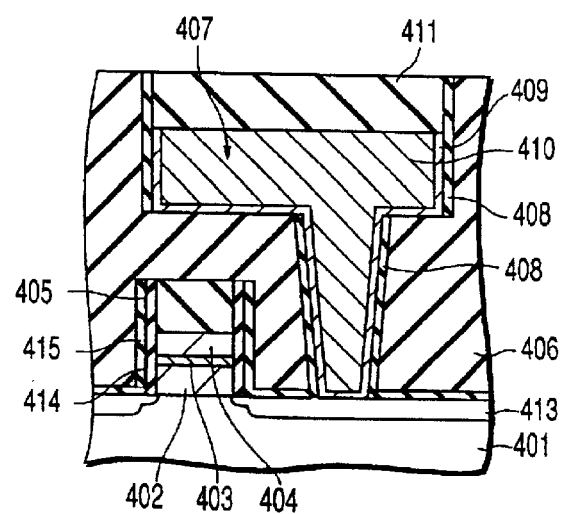
FIG. 30B is a cross sectional view showing a DRAM using a conventional silicon nitride film.

FIGS. 30A and 30B cover the case where the distance between the gate electrode and the metal wiring is large. In this case, if the pitch of the gate electrodes is made smaller, the effect produced by a lower permittivity and a smaller thickness of the silicon nitride film of the present invention is rendered more prominent.

Since it is possible to decrease the parasitic capacitance, to diminish the capacitor area and to decrease the distances between the adjacent wirings and between the adjacent gate electrodes, the chip size can be finally made smaller. Also, since a so-called "RC delay resistance" is diminished, the device characteristics can be improved.

On the other hand, the silicon nitride film 411 is formed in a thickness of 200 nm in the conventional technique. The conventional silicon nitride film 411 is formed typically at 780° C. under a reactor inner pressure of 66.5 Pa, and DCS/ammonia flow rate ratio of 150/1500. In this case, the silicon nitride film 411 is formed at a rate of about 3.0 nm/min. If the silicon nitride film 411 is formed at 780° C., however, the barrier metal film 409 fails to withstand the heat of the high temperature, with the result that reaction takes place between the metal wiring 410 and the silicon substrate 401.

Originally, if the silicon nitride film 411 is formed at 780° C., a damage is done to the MOS transistor formed in advance, making it impossible to use the MOS transistor.

It is certainly possible to lower the film-forming temperature to 700° C. in the conventional technique, too. However, where the film-forming temperature is set at 700° C., the film-forming rate is 0.7 nm/min. It follows that about 5 hours are required for forming a cap silicon nitride film in a thickness of 200 nm.

In the actual process, required are the time for the temperature to become uniform and the purging time, with the result that about 9 hours are required for forming the films in the entire process. What should be noted is that, even if a cap silicon nitride film is formed at a relatively high temperature of 700° C., the productivity is markedly lowered.

Under the thermal budget of such a relatively high temperature and a long time, a $Ti_xSi_y$ film formed at the bottom of the contact hole is agglomerated in a portion, leading to an increase in the contact resistance. Further, under the thermal budget noted above, the diffusion layer once activated is inactivated again, or the diffusion layer is diffused again so as to increase the resistance of the diffusion layer.

As described above, if the film-forming temperature is lowered in the method of forming a silicon nitride film using dichlorosilane, a problem is generated that the productivity is markedly lowered. However, the preset invention has made it possible to form a silicon nitride film at a high speed under low temperatures. In other words, the present invention has established a method of forming a silicon nitride film used in a semiconductor device of the next era.

In the ninth embodiment of the present invention, the technical idea of the present invention was applied to formation of a cap silicon nitride film. However, the technical idea of the present invention can also be employed for formation of the insulating film 414 on the upper portion of the gate and the gate side wall insulating films 415 and 416.

Also, in the ninth embodiment of the present invention, the technical idea of the present invention was employed for lowering the RIE rate of the silicon nitride film. However, the technical idea of the present invention can also be employed for lowering the other etching rates. For example, it is also possible to lower the etching rate in the case where a silicon nitride film is etched with a dilute hydrofluoric acid.

Figure 31:
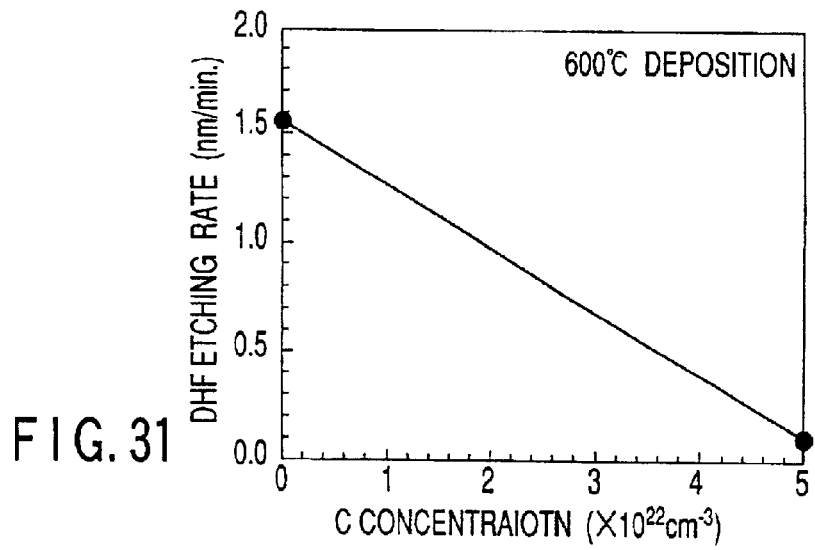
FIG. 31 is a graph showing the carbon concentration in a silicon nitride film and the etching rate of the silicon nitride film when etched with a dilute hydrofluoric acid.

FIG. 31 is a graph showing the relationship between the carbon concentration in a silicon nitride film and the etching rate when the silicon nitride film is etched with a dilute hydrofluoric acid. The dilute hydrofluoric acid used in this experiment was prepared by diluting a 46% of concentrated hydrofluoric acid with water 200 times as much in volume as the concentrated hydrofluoric acid.

As apparent from the graph, the etching rate of the silicon nitride film when etched with a dilute hydrofluoric acid can be decreased by introducing carbon into the silicon nitride film. This implies that silicon nitride films can be made different from each other in etching rate by controlling the carbon content of the silicon nitride film.

Figure 32A:
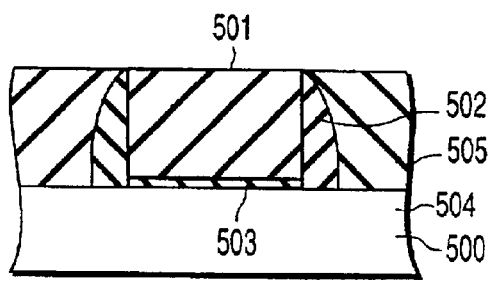
FIGS. 32A and 32B are cross sectional views showing a modification of the ninth embodiment of the present invention.
Figure 32B:
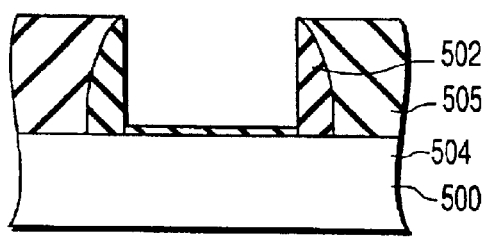
Figure 33:
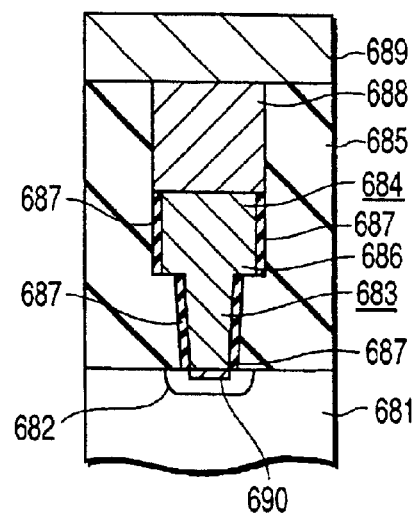
FIG. 33 is a cross sectional view showing a cross section of a conventional DRAM in a direction perpendicular to the longitudinal direction of the channel of a MOS transistor.
Figure 34:
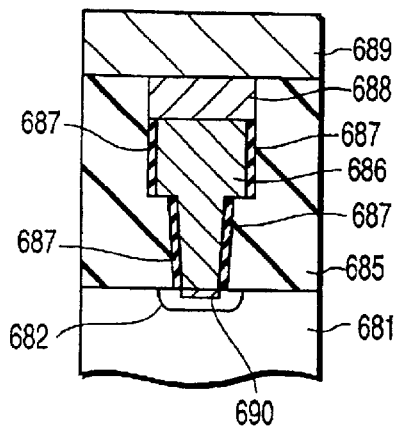
FIG. 34 is a cross sectional view showing a problem in the case where a silicon nitride film is formed by an LPCVD method using dichlorosilane etc.
Figure 36:
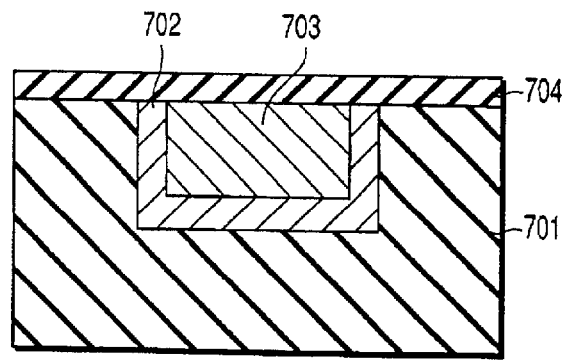
FIG. 36 is a cross sectional view showing a region in the vicinity of a conventional Cu wiring.
Figure 35:
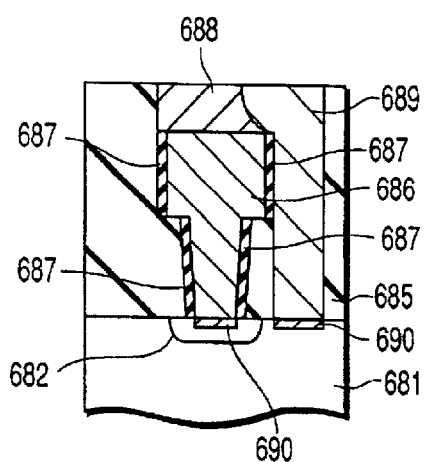
FIG. 35 is a cross sectional view showing another problem in the case where a silicon nitride film is formed by an LPCVD method using dichlorosilane etc.

The particular phenomenon is positively utilized in, for example, a damascene metal gate process. Specifically, a silicon nitride film 501 that does not contain carbon is formed as a dummy gate and a silicon nitride film 502 containing carbon is formed as a gate side wall insulating film, as shown in FIG. 32A, followed by applying a wet etching with a dilute hydrofluoric acid solution so as to remove easily and selectively the silicon nitride film 501, as shown in FIG. 32B. Incidentally, the structure shown in FIGS. 32A and 32B includes a silicon substrate 500, a gate insulating film 503, a source/drain diffusion layer 504 of an LDD structure, and an interlayer insulating film 505.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising the steps of:

preparing a semiconductor substrate; and forming a silicon nitride insulation film on said semiconductor substrate by a low pressure chemical vapor deposition method using a compound having a Si—Si bond and a Si—Cl bond as a Si raw material.

2. A method of manufacturing a semiconductor device according to claim 1, wherein said silicon nitride film is formed to cover the surfaces of said semiconductor substrate and a gate electrode formed on the semiconductor substrate, and said method further comprises the steps of:

forming an interlayer insulating film on said silicon nitride film; and forming a through-hole extending through a portion of said interlayer insulating film and silicon nitride film to reach the surface of the semiconductor substrate.

3. A method of manufacturing a semiconductor device according to claim 2, wherein the raw material of said silicon nitride film is represented by a general formula $Si_nCl_{2n+2-x}H_x$, where n is an integer not smaller than 2, and x is an integer not larger than 2n+1.

4. A method of manufacturing a semiconductor device according to claim 1, wherein the said silicon nitride film is formed to a thickness of 10 nm or more.

* * * * *